(12) United States Patent
Cohen

(10) Patent No.: US 6,622,283 B1
(45) Date of Patent: Sep. 16, 2003

(54) DIGITAL SIGNAL PROCESSOR DECODING OF CONVOLUTIONALLY ENCODED SYMBOLS

(75) Inventor: Paul E. Cohen, San Jose, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

(21) Appl. No.: 09/493,767

(22) Filed: Jan. 28, 2000

(51) Int. Cl.$^7$ .............................................. H03M 13/03
(52) U.S. Cl. ...................... 714/794; 714/792; 714/795; 714/796
(58) Field of Search ................................ 714/792, 794, 714/795, 796

(56) References Cited

U.S. PATENT DOCUMENTS

| | | | | |
|---|---|---|---|---|
| 5,220,570 A | * | 6/1993 | Lou et al. ..................... | 714/791 |
| 5,479,419 A | * | 12/1995 | Naoi et al. ................... | 714/794 |
| 5,781,569 A | * | 7/1998 | Fossorier et al. ........... | 714/795 |
| 5,787,127 A | * | 7/1998 | Ono et al. .................... | 375/341 |
| 5,878,092 A | * | 3/1999 | Choi ........................... | 375/341 |
| 5,974,091 A | * | 10/1999 | Huff ............................ | 375/265 |
| 6,035,428 A | * | 3/2000 | Jekal .......................... | 714/702 |
| 6,088,404 A | * | 7/2000 | Jekal .......................... | 375/341 |
| 6,108,386 A | * | 8/2000 | Chen et al. ................. | 375/341 |
| 6,134,697 A | * | 10/2000 | Jekal .......................... | 714/792 |
| 6,161,210 A | * | 12/2000 | Chen et al. ................. | 714/786 |
| 6,222,889 B1 | * | 4/2001 | Lee ............................ | 375/265 |
| 6,259,749 B1 | * | 7/2001 | Andoh ........................ | 375/341 |
| 6,327,317 B1 | * | 12/2001 | Chennakeshu et al. ..... | 375/341 |
| 6,374,387 B1 | * | 4/2002 | van den Berghe .......... | 714/790 |

OTHER PUBLICATIONS

"A Multistate Search Of Algebraic Celp Codebooks," Miguel Arjona Ramirez and Max Gerken, Electronics Eng. Dept., University of Sao Paulo.

"A Fast Search Method Of Algebraic Codebook By Reordering Search Sequence,"0 Nam Kyu Ha, Samsung Advanced Institute of Tecnology.

"Generalized Trace–Back Techniques for Survisor Memory Management in the Viterbi Algorithm," Robert Cypher and C. Bernard Shung, Journal of VLSI Signal Processing, 5, 85–94, 1993.

"Convolutional Encoding And Viterbi Decoding" Dion Messer Funderburk, Apr.

"A Fast Search Method Of Algebraic Codebook By Reordering Search Sequence," Nam Kyu Ha, Samsung Advanced Institute of Technology.

"Memory Management In A Viterbi Decoder," Charles M. Rader, Transactions On Communications, vol. Com–29, No. 9, Sep. 1981.

"Viterbi Decoder Designs Using IP Soft Cores," Scott R. Powell, Wayne L. Marking, and Thomas M. Cesear, Inventra™Parameterized Soft Cores Business Unit, Mentor Graphics Corp.

"Digital Signal Processor," NEC, Sep. 1998.

* cited by examiner

*Primary Examiner*—Albert Decady
*Assistant Examiner*—Joseph D. Torres
(74) *Attorney, Agent, or Firm*—Skjerven Morrill LLP

(57) ABSTRACT

In one embodiment, a file of all the initial states (or their equivalents) and the nth surviving states associated with the initial states is stored along with the path metric. The initial states (or their equivalents) are an index to a previous file. A.new file or files are then generated. An appropriate criterion is utilized to select a final surviving state. The path can be traced back through a plurality of files and the "most likely" path determined. The identifying binary numbers of the final states of each file and the binary numbers of an original initial state determine the "most likely" sequence of convolutionally-encoded symbols received by the decoder. The convolutional decoding can be implemented with a digital signal processor and a dedicated peripheral unit. This apparatus can provide an efficient use of memory for the possible decoding paths.

43 Claims, 20 Drawing Sheets

| Y<1> Y-Data Memory | |
|---|---|
| A... ▷ | Hexadecimal |
| 2900 | 0a00 |
| 2901 | 0a00 |
| 2902 | 0a00 |
| 2903 | 0a00 |
| 2904 | 0800 |
| 2905 | 0800 |
| 2906 | 0800 |
| 2907 | 0800 |
| 2908 | 0a00 |
| 2909 | 0a00 |
| 290A | 0a00 |
| 290B | 0a00 |
| 290C | 0b00 |
| 290D | 0b00 |
| 290E | 0a00 |
| 290F | 0a00 |
| 2910 | (no memory) |

*FIG. 17B*

DIGITAL SIGNAL PROCESSOR DECODING OF CONVOLUTIONALLY ENCODED SYMBOLS

CROSS-REFERENCE TO RELATED APPLICATIONS

U.S. application Ser. No. 09/493764, filed on Jan. 28, 2000, and entitled "Method and Apparatus For Implementation of a Decoder For Convolutionally Encoded Symbols" is a related U.S. application is incorporated by reference herewith.

BACKGROUND OF THE INVENTION

1. Field of the Invention

This invention relates generally to communication techniques and, more particularly, to the decoding of digital signals in a communication system. In the communication system envisioned by the present invention, each bit of information has been encoded in a multiplicity of transmitted signals. The resulting signals are generally referred to as convolutionally encoded symbols.

2. Description of the Related Art

Communications channels in general and digital wireless communications in particular must counteract noise which may obliterate individual transmitted symbols. Conceptually, there are two approaches to this problem: one, by introducing redundancy and another, by smearing the transmitted information over multiple symbols. These approaches are not entirely separate since any redundancy makes it easier to spread the information over a plurality of signals, but neither are the two approaches identical.

Convolution codes are often used to implement the smearing of information over several symbols. Simply put, the EXCLUSIVE_OR (XOR) logic operation is applied to several recent information bits (equivalently, the information bits are summed modulo 2) to generate a bit that is to be transmitted. A second or third convolution code can be used to generate a second or third bit and thereby introduce redundancy as well as the information smearing in the transmitted symbols. These several bits are often combined and transmitted as a single symbol, represented perhaps by one state of a modulation constellation.

Referring to FIG. 1, an example of channel coding used for IS-95 is illustrated. The IS-95 encoder 10 has a series of delay line components 11. A first set of selected signals from the terminals of the delay line components 11 are applied to a first XOR component 12, while a second set of selected signals from the terminals of the delay line components are applied to a second XOR component 14. This rate ½ code has constraint length 9, i.e. 9 delay line components 11. Notice that for this encoder, each input bit results in two different output bits and that each of the two output bits depends on the current input bit and either four or five of the preceding eight input bits. Assuming that the preceding eight bits are fixed, there are only two output bit-pairs possible from XOR components 12, 14 depending upon the next input bit. However, there are four possible output bit-pairs that could be transmitted in all when the preceding bits are not fixed.

Note that, for the exemplary IS-95 channel encoder, a single input bit affects the next 9 output bit pairs, no one of which reflects exactly the information of that single input bit. The convolution codes smear the information of the single input bit over eighteen bits of output bit pairs. The virtue of this smearing of information is that, when a single symbol (or even more than one symbol) is corrupted in transmission, the decoder often can still recover the input information bit.

Computing Metrics

Pairs of output bits become symbols that have some physical representation on the communications channel. These symbols are transmitted and the receiver makes a measurement of the resulting signal that it receives. Of course, the received signal differs from the signal that is transmitted and the difference between the two signals is called noise. The receiver can calculate the distance between the received signal and each of the four symbols that might have been transmitted. The details of the computation of this metric depend on the particular communications channel and how the states are represented physically.

In the receiver's computation of metrics, a first option provides for the conversion of the received signal to a digital signal (in this case a pair of bits) and then computation of the metric. Apparatus using this approach is called a hard decision decoder. The other option, which is more complex computationally but which generally results in fewer errors, is the computation of the metric from the original signal levels; this process being provided by a soft decision decoder.

Trellis Decoding

Referring next to FIG. 2, a four-state trellis diagram, according to the prior art, is illustrated. Each column of the trellis diagram represents a Viterbi decoder at an instant of time and the arrows in the diagram represent the transitions of that decoder from one instant of time to the next. Notice that the nodes of the diagram are labeled with a pair of binary digits, 00, 01, 10, 11, the binary digits representing the state numbers 0, 1, 2, and 3. Also observe that the arrows between nodes are labeled either 0 or 1 and that the label of each node is always formed by concatenating the labels any pair of arrows from two columns earlier that lead to that node. Expressed another way, the number of each node specifies the last two (because this is a four-state decoder) transitions made to get to that state. Of course multiple paths lead to each state, but these paths differ only at earlier transitions.

Referring once again to FIG. 2, in moving from one increment of time to the next, the Viterbi decoder, i.e., a decoder that decodes convolutionally encoded symbols, receives or computes metrics representing the distance from the received signal to what would be transmitted for an information bit of "0" and for an information bit of "1". This computation is performed for each possible history of transmitted bits as encoded by the various state identification numbers. These metrics are referred to as transition metrics and they include the noise for a current symbol. The transition metrics are summed along the paths and these sums are called path metrics Two arrows represent transitions that can enter each node and two other arrows represent transitions that can leave each node. At each node, path metrics are associated with each incoming arrow. The trellis decoder selects the smaller path metric, i.e., the path metric representing the smaller noise figure of the two incoming signals. All of the paths associated with the non-selected arrow (i.e., transition) are permanently abandoned by the trellis decoder. The transition metric corresponding to an information bit of "1" is added to the surviving incoming path metric and the sum is forwarded to the node at the next time instant along the arrow labeled 1. Similarly, the transition metric corresponding to an information bit of 0 is added to the surviving incoming path metric and sent to the node at the next time instant along the arrow labeled 0. The configuration of two incoming arrows and the two outgoing arrows from a node can be described as a butterfly diagram.

Referring to FIG. 3, examples of butterfly diagrams are shown for a 16-state encoder. For each butterfly diagram, two states serve as input transitions to determine two states for the next time increment. For example, for the butterfly diagram represented by the solid lines, the states 0001 and 1001 serve as inputs to determine the states 0100 and 0011 for the next time increment. Unfortunately, a significant amount of memory is needed to specify each state. In implementing the decoding algorithm, not only is the history information associated with each state retained, but the path metrics are also retained, i.e., for selecting between two input transitions that terminate on the same state. If the butterfly operations are processed as indicated in FIG. 3, two copies of these data groups would be required to be saved in order that the storage resulting from one butterfly diagram does not corrupt the input data needed to process the result of a different butterfly diagram.

An alternative to the doubling of the required memory is to re-assign the state table at each iteration as illustrated in FIG. 4. Note also in FIG. 4, at each stage, the butterfly operation is applied in a quite regular fashion, the pattern merely changes from one time increment to the next time increment. Specifically, the height of the butterfly transition is constant within each stage, but reduces by half from one stage to the next stage.

The primary, but not sole advantage to re-arranging the order of the state memories is that, as the data for a state is updated, the new data can be stored in the same locations that were used, although for a different state number, at the previous stage. In more visual terms, referring to FIG. 4, the inputs and outputs for each butterfly operation lie at the same positions of the arrays, i.e., the transitions are horizontal.

By selecting the transition with the smaller path metric in the decoder, at each step in time, the number of paths stays constant in the following sense. Half of the entering paths are abandoned, but the surviving paths are appended with both 0 and with 1, creating two paths for each of the surviving paths.

After a sufficient period of time, various paths are abandoned and the number of surviving paths that (at a fixed earlier time $t_0$) pass through a given state becomes ever smaller. Eventually, all of the surviving paths will pass through only a single state and at that time, the decoder can conclude that the most likely information bits are represented by that particular state at time $t_0$.

In implementing a Viterbi decoder, two practical difficulties are present: computational load and the demand for memory. The computational load is more a result of the high symbol rates than of the complexity of the calculation, but a strong incentive still exists to design the algorithms to be as efficient as possible.

The memory demands of a Viterbi decoder derive from the need to maintain an indefinitely long history of the paths surviving to each of the states. Maintaining long histories for each of the 256 states of an IS-95 decoder, for example, can require large amounts of memory. A common solution to the problem of maintaining long histories has been to force the decoder to make decisions prematurely and therefore guarantee a fixed history length. However, such truncations introduce errors and, in order to avoid excessive errors with this approach, history lengths of 4–5 times the constraint length are generally recommended.

Traditional Viterbi decoders, i.e., decoders of convolutionally encoded symbols, record (as a single bit in "traceback" memory) each decision that is made. At a later time, the decoder must work backward through this historical record, one bit at a time, to determine the final decoded record. This trace-back operation can be computationally intensive.

Often, data is encoded in "frames" consisting of a fixed number of bits and with several zero's added to the end. This procedure allows the decoder to assume that the final state of the frame is zero. Having a known final state greatly simplifies the trace-back problem.

A need has been felt for an apparatus and a method having the feature that the implementation of the decoding of signals resulting from signals provided by convolutionally encoded symbols is improved. Another feature of the apparatus and method would be that the implementation of the decoding of convolutionally encoded symbols algorithm requires less memory. Still another feature of the apparatus and method would permit path trace-back to be performed in units of more than one bit at a time (viz., {constraint_length–1} bits at a time). Yet another feature of the apparatus and method would be the decoding of convolutionally encoded symbols in blocks of symbols.

SUMMARY OF THE INVENTION

The aforementioned and other features are accomplished, according to the present invention, by providing a unit, hereinafter called a block trellis decoder, that makes decoding decisions determined by the multiple paths entering and exiting from the nodes of a Viterbi trellis diagram. In the present invention, rather than maintain a full history for each node, linked lists of histories are maintained. A procedure for selecting paths based on path metrics is used. Because paths are abandoned at each step, the histories for more distant past events can be compressed to become ever-shorter tables. A set of paths can be summarized in a single file. Each file includes, for each state through which a surviving path passes: a state binary number, the state binary number indicating the set transition history; an index number pointing to a state binary number in the previous file; and a path metric quantity. Forcing the decoder to make premature decisions may still be necessary, but this will be because the total memory describing the transition history has been exhausted. Because this memory is used flexibly and efficiently, forcing premature decision will be necessary less often than when all history back to a fixed point in the past is maintained. The present invention is implemented, according to one embodiment, by a digital signal processor and a dedicated peripheral unit. The dedicated peripheral unit is designed to perform butterfly operations efficiently. By appropriate choice of interface registers and interaction between the digital signal processor and the peripheral unit, the speed of the decoding process can be improved.

BRIEF DESCRIPTION OF THE DRAWINGS

The present invention may be better understood, and its numerous objects, features, and advantages made apparent to those skilled in the art by referencing the accompanying drawings.

FIG. 13A is a block diagram of one embodiment of the hardware block trellis decoder according to the invention, while

FIG. 17A, FIG. 17B, and FIG. 17C show the contents of selected registers of the second embodiment of the hardware block trellis decoder which illustrate the operation of the invention.

The use of the same reference symbols in different drawings indicates similar or identical items.

DESCRIPTION OF THE PREFERRED EMBODIMENT(S)

Detailed Description of the Figures

FIG. 1, FIG. 2, FIG. 3 and FIG. 4 have been described in relationship to the prior art.

In the preceding description, the terms Viterbi and trellis were both used in a generally accepted manner. The device that decodes convolutionally encoded symbols is typically called a Viterbi decoder. As indicated above, the present invention relates to a type of Viterbi decoder. However, a term is needed for a specific type of Viterbi decoder. This designation is needed for a unit that makes decisions illustrated by the multiple paths in and out of the nodes of FIG. 3. Hereinafter, this unit will be called the block trellis decoder and the operations of the block trellis decoder will be referred to as block trellis decoding operations. As will be clear to those familiar the application of the Viterbi algorithm, this terminology is specific to the discussion of the present invention.

The input to a Viterbi decoder inherently has a bit-at-a-time nature, but the consumer of its output is a processor that works more naturally and efficiently with data that is organized into bytes or even 16-bit words. As was discussed above, for a decoder with $2^B$ states, a state number itself specifies the most recent B transitions leading to that state. These two considerations lead to a decoder design, which (for a 256 state decoder) is byte-oriented in the sense that eight time-steps are taken, representing eight input symbols and then the decoder outputs a table which resolves as much of the history as it can.

Figure 1:
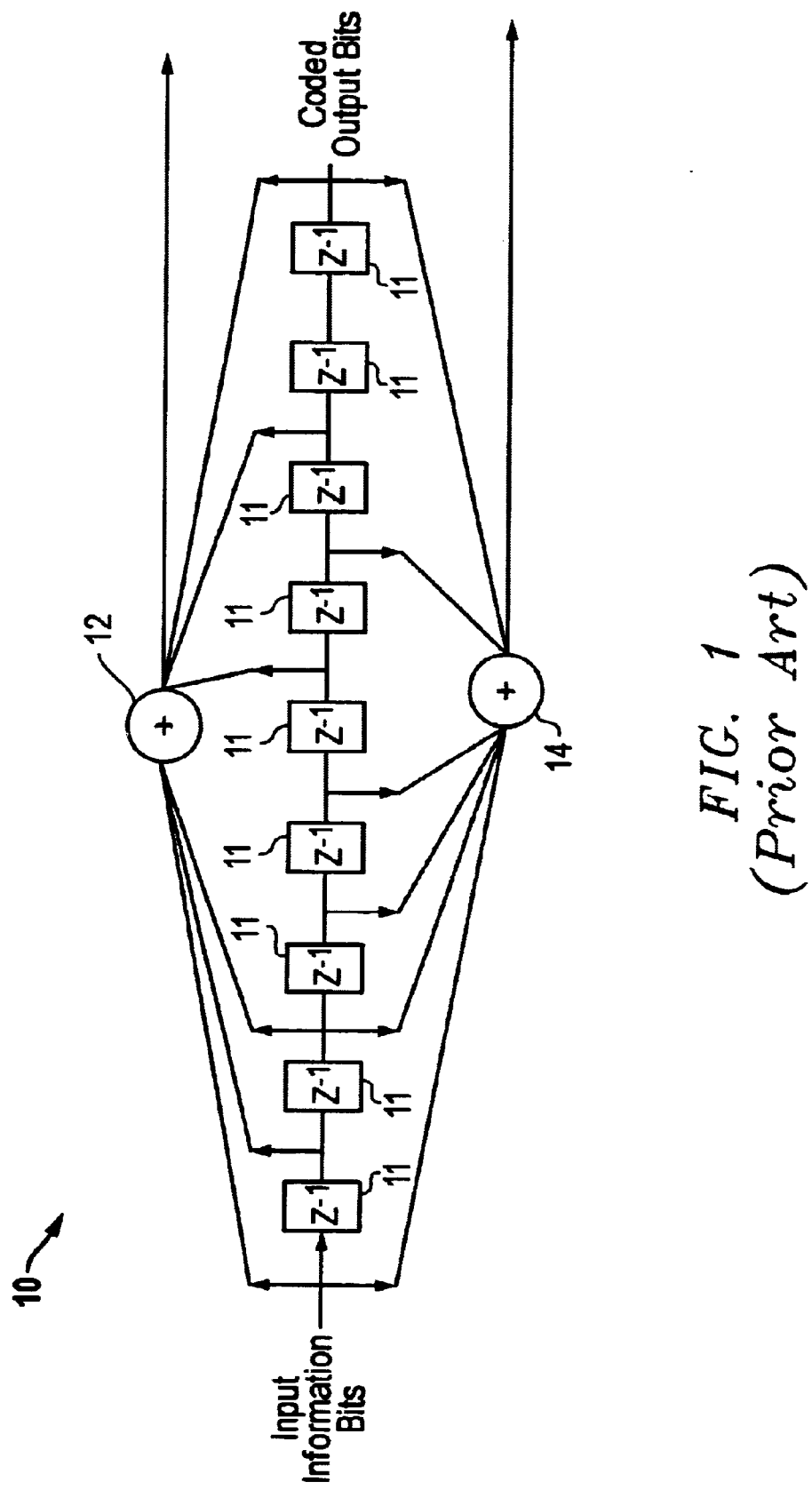
FIG. 1 is an example of channel or convolutional encoding according to the prior art.
Figure 2:
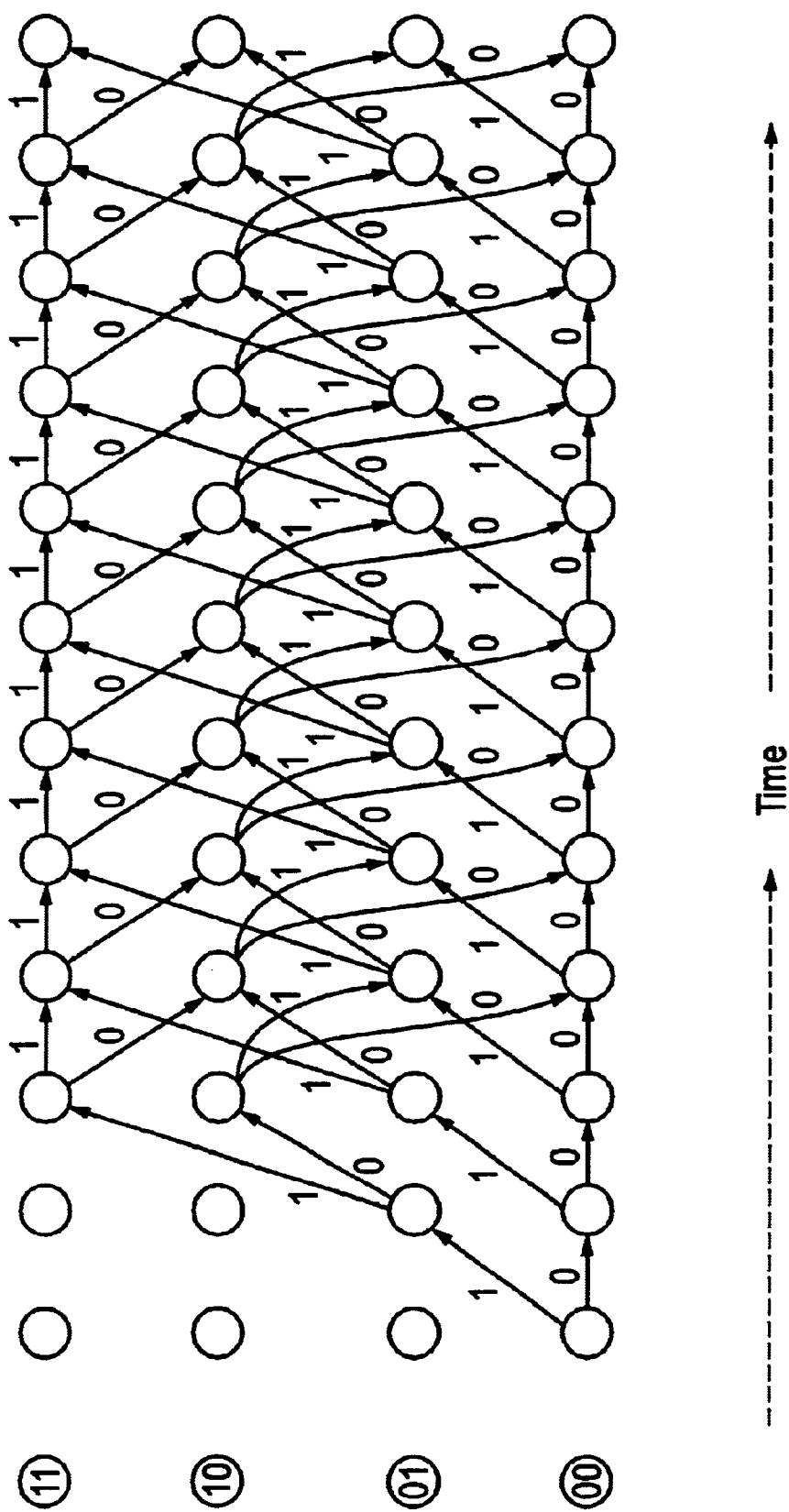
FIG. 2 illustrates a 4-state Viterbi trellis diagram according to the prior art.
Figure 3:
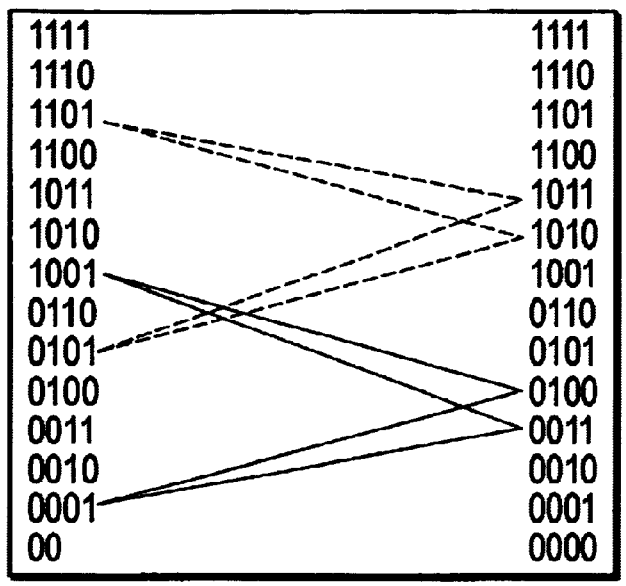
FIG. 3 illustrates examples of butterfly diagrams for a 16 state decoder unit according to the prior art.
Figure 4:
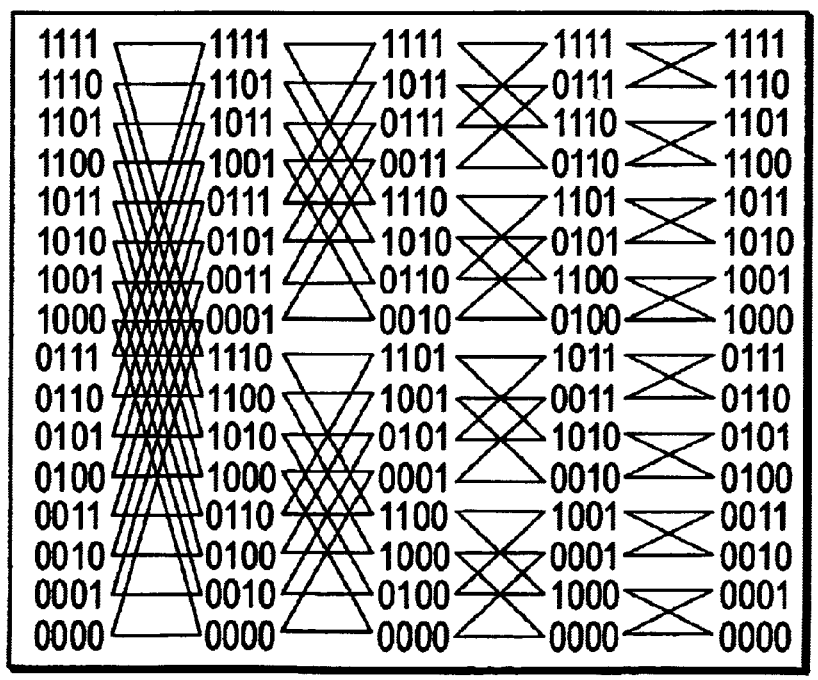
FIG. 4 illustrates the cyclic nature of the butterfly diagrams for a 16 state decoder unit wherein the state designation is altered from the processing of one symbol to the next symbol according to the prior art.
Figure 5:
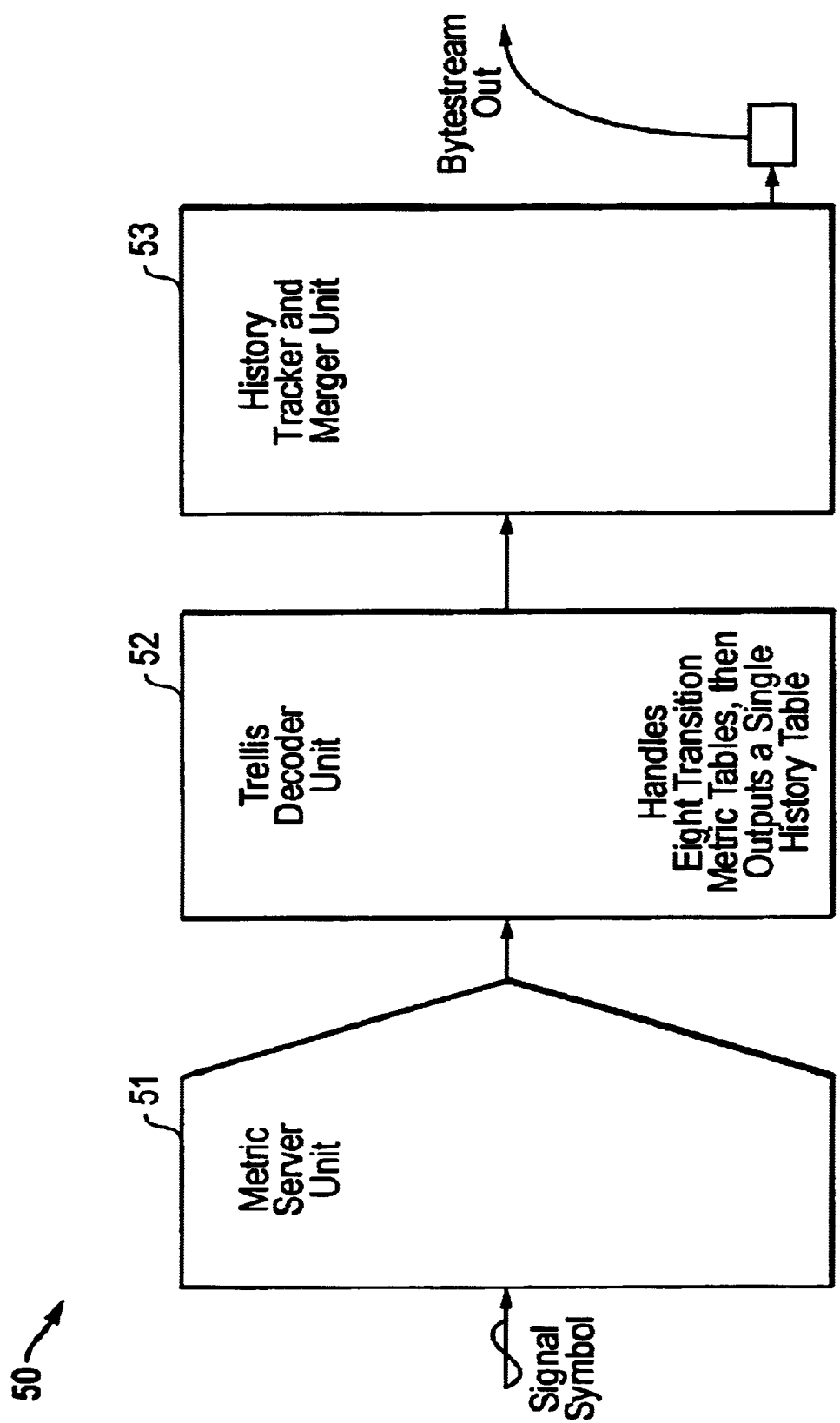
FIG. 5 illustrates s a block diagram of a Viterbi decoder according to the present invention.

Referring to FIG. 5, a block diagram, illustrating the overall operation of the inventive block trellis decoder 50 is shown. The term "block trellis decoder" is derived from a characteristic of the decoder, the characteristic being that the block trellis decoder processes a block of B symbols and then provides an output table before continuing the processing of the next block of B symbols. The block trellis decoder 50 includes a metric server unit 51, a trellis decoder unit 52, and a history tracker and merger unit 53. The metric server unit 51 receives the communication signals or symbols from the channel and develops the transition metrics in the form of tables, a transition metric being assigned to each state. The transition metric tables are transferred to the trellis decoder 52. The trellis decoder 52 maintains internally a history of the most recent transitions (from 0 to 8, depending on time). For IS-95, for example, the output of the trellis decoder 52 is a table of up to 256 words. Each word is a 16-bit structure that includes two eight-bit fields; one eight-bit field (the index) represents the path transition metrics that occurred just before those transitions that are recorded within the trellis decoder. The remaining eight-bit field holds a pointer into the next earlier table, a table that was recently passed along to the history tracker and merger unit 53. As noted before, the history tracker and merger unit 53 maintains these tables, subject to memory being available, for as long as necessary until a table is reduced to a single entry. At that time, the remaining entry and any entries that it points to in succeeding tables represents a decision that can be reported out from the history tracker and merger unit 53.

In FIG. 5, all three units may be implemented in software, just, as it is possible that all three units may be implemented in hardware; however, for many if not most applications, units 51 and 53 are anticipated as being implemented as software being processed by a digital signal processor (DSP) or other data processing unit while the trellis decoder unit 52 will be implemented in hardware.

Referring once again to FIG. 5, the operation of the metric server 51 for computing the transition metrics for the IS-95 decoder can be illustrated, using two stage encoding in the following manner. The metric server 51 receives channel information in the form of signals R, wherein $$R=P(s_x+d)=P \cdot S$$

where P is a power factor, which for the duration of a frame can be treated as a constant, $s_x$ is the transmitted signal, and d is the channel distortion. Consecutive pairs of these signals encode a single bit.

The metric server 51 can compute transition metrics by summing pairs of terms $\pm R_i$ with the selection of + of − taken according to which symbols are generated by candidate state transitions for the encoder. The justification for taking simple sums rather than computing the squared Euclidean metric (by summing the terms of the form $(R_i \pm |P|)^2$) is that these two approaches yield path metrics that differ by only a constant of the form $$\Delta = \Sigma(R_i^2 \pm |P|^2)$$

For decoding a single frame at a particular rate, using only the middle term (with the constant, 2|P|, canceled out) is equivalent to the more complex computation of the Euclidean metric. The quantities $\pm R_i \pm R_{i+1}$ are not only computationally simpler, but avoid the issue of estimating a value for |P|.

The four choices of signs in the expression $\pm R_i \pm R_{i+1}$ provide the transition metrics, $m_0$, $m_1$, $m_2$, and $m_3$ that are required. However, these numbers are signed. A way to avoid the use of signed metrics is to use instead the metrics defined by $TR00 = m_0 - m_{min}$, $TR01 = m_1 - m_{min}$, $TR10 = m_2 - m_{min}$, and $TR11 = m_3 - m_{min}$ (where $m_{min}$ in the minimum of $m_0$, $m_1$, $m_2$, and $m_3$). This operation is permissible because the difference is only a constant, $m_{min}$. In addition, one of the four metrics is always zero.

An equivalent (but computationally simpler) means for computing the same signed transition metrics is summarized as follows. Given a pair of input signals, $R_a$ and $R_b$, let $A_0 = R_a$ if $R_a > 0$, otherwise $A_0 = 0$ $A_1 = 0$ if $R_a > 0$, otherwise $A_1 = -R_a$ $B_0 = R_b$ if $R_b > 0$, otherwise $B_0 = 0$ $B_1 = 0$ if $R_b > 0$, otherwise $B_1 = -R_b$ It follows that $TR00 = A_0 + B_0$ $TR01 = A_0 + B_1$ $TR10 = A_1 + B_0$ $TR11 = A_1 + B_1$ As will be clear, the transition metrics can be calculated in a manner different from the manner described above for the IS-95 example. For the present invention, it is useful that the values be unsigned and critical that the larger metric correspond to a less likely transition.

After generating the transition metrics in the metric server 51, a table of metric values is transferred to the trellis decoder 52. For decoding a rate ½ convolution code, this table will have four entries. More generally, a rate 1/n code will require this table to have $n^2$ entries. In the trellis decoder, three tables of length $N = 2^B$ are maintained. One table, the history table keeps track of the transitions made while decoding the current block. Together with the history table, a second table, the index table, serves in constructing the table to be output at the end of the processing the current block. The index table holds the pointer into tables that were output at the end of earlier blocks (or 0 if there were no earlier tables). Both the history and index tables are words of data that are B bits wide. Finally, a table of path-metrics is used to keep track of the sum of transition metrics for the surviving paths. The width of the path-metrics is determined as a compromise between performance (bit-error rate) and cost (substrate size and circuit power). The activity of the trellis decoder unit can be understood as follows.

Figure 6A:
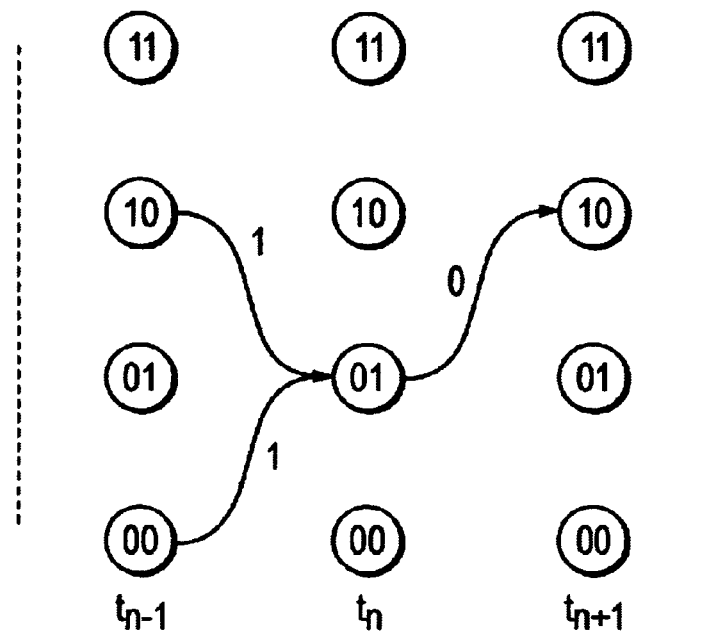
FIGS. 6A–6B illustrate the multiplicity of paths that are described by the state identification numbers for a four state Viterbi decoder according to the present invention.
Figure 6B:
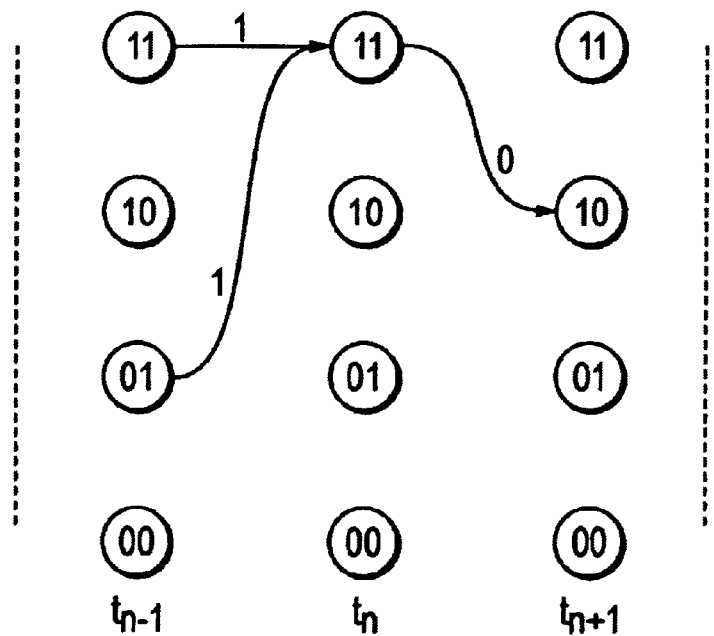

Before proceeding, it should be recalled that the state number is determined by the sequence of recent transitions that comprise the binary identification of the state number. For example, referring to FIG. 6, for the four state encoder, the (10) state is reached by 0-transition preceded by a 1-transition. However, as can be seen from FIG. 6A, two paths have the 1-transition followed by a 0-transition. Referring to FIG. 6B, two more paths are possible that provide a 1-transition followed by a 0-transition. However, as will be clear by review of FIG. 6A and FIG. 6B, each of these paths has a different starting state. Therefore, focusing on a path within a block, the starting state number and the final state number determine the path for the block of symbols being processed by the trellis decoder 52. Summarizing, because the identification of a state is determined by the preceding transitions, within a block a path involving a plurality of states is uniquely determined by the initial state and the final state when the number of intervening transitions is equal to the binary characters identifying the state.

Let the states of a path through the $2^B$ state trellis be, where the block size is B (=constraint_length−1), $$0 = S_0, S_1, \ldots, S_B, S_{B+1} \ldots$$

As noted above, the fact that "the path assumes states $S_{nB}$ at time nB" determines the transitions during the preceding block of B symbols. It follows that the sequence of states $S_B$, $S_{2B}$, $S_{3B}$, ... is sufficient information to construct all of the transitions (equivalently, the entire path). The strategy used for the block trellis decoder is to develop, at the end block n+2, an output table which, in general, makes it easy to compute for a surviving path, $S_{nB}$ from $S_{(n+1)B}$. Notice that makes it easy, at any time, to compute the entire surviving path that ends at a particular state, $S_{nB}$.

Figure 7:
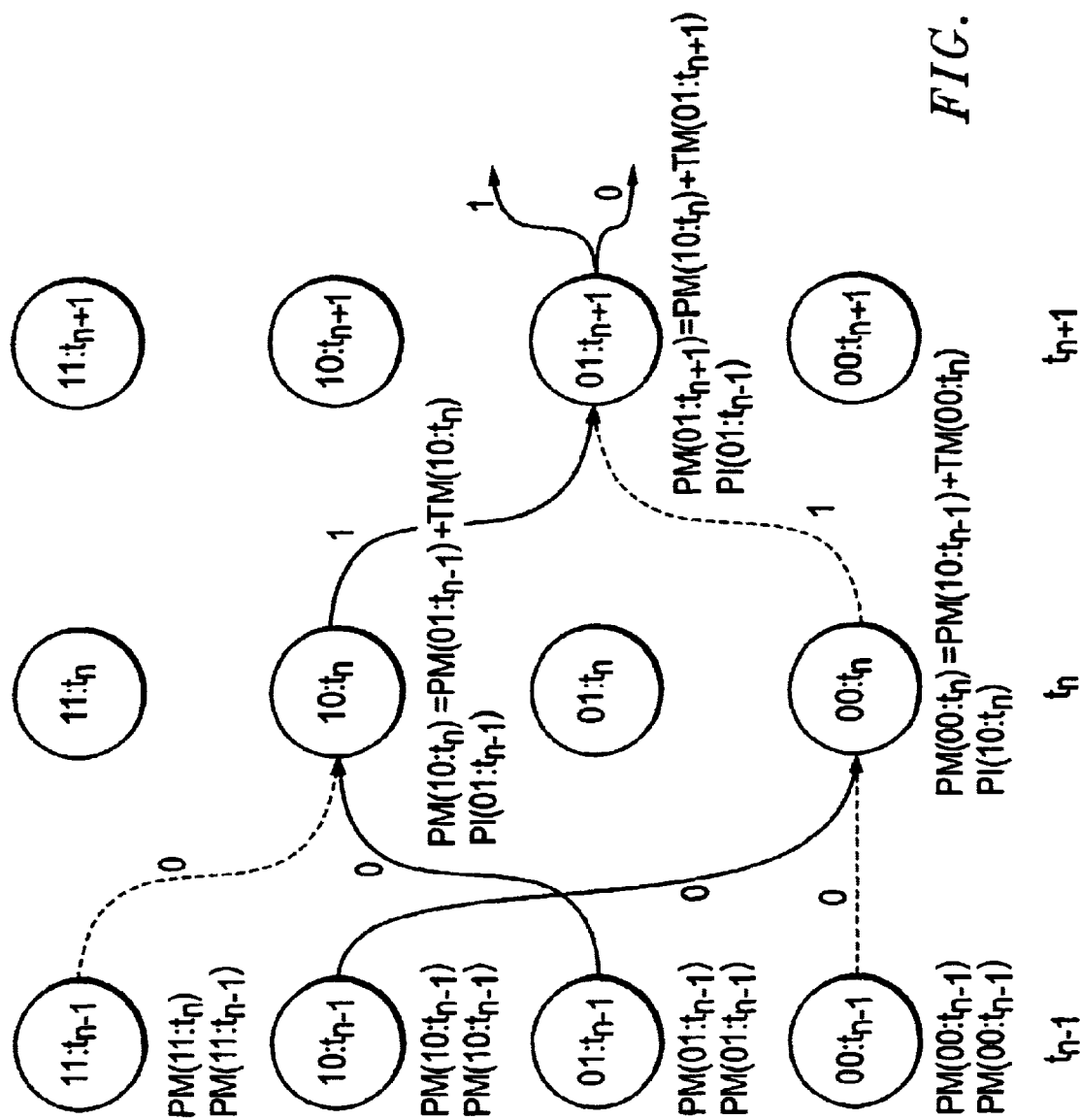
FIG. 7 illustrates the processing of a symbol in a four-state decoder according to the present invention.

The operation of the decoder in processing a single symbol is illustrated using a four-state decoder as an example. Referring to FIG. 7, at time $t_n$, a certain set of paths have survived; in fact, one path has survived for each of the four states and so each state will have a path metric as well as a (two-bit) history and a (two-bit) index associated with the state. Associated with the symbol detected at time $t_n$, is a table of transition metrics, however, the particular metric value associated with a '1' transition will depend on which state $(xy:t_n)$ is under consideration. Associated with state $(xy: t_n)$ is a path metric $PM(xy:t_n)$ as well as two transition metrics, $TM^0(xy:t_n)$ and $TM^1(xy:t_n)$. The first of these transition metrics is associated with a transition to the state $(y0:T_{n+1})$ and the second with a transition to the state $(y1:T_{n+1})$. Also associated with state $(xy:t_n)$ is an index value, $I(xy:t_n)$, and a history value, $H(xy:t_n)$. From consideration of FIG. 7, two $(xy:t_n)$ states can have a 1-transition to the $(01:t_n)$ state, $(00:t_n)$ state and the $(10:t_n)$ state as shown in FIG. 7. The trellis decoder unit can select either the path surviving to the $(00:t_n)$ state or the path surviving to the $(10:t_n)$ state. The trellis decoder makes this selection by determining which of $\{PM(00:t_n) + TM^1(00:t_n)$ or $(PM(10:t_n) + TM^1(10:t_n)\}$ is smaller. In FIG. 7, the second of these quantities, $\{PM(10:t_n) + TM^1(10:t_n)\}$, is the smaller so the path surviving to the $(10:t_n)$ state is extended to be the one to survive to the $(10:t_n)$ state. This path is illustrated in FIG. 7 by the fact that the path through the $(10:t_n)$ state and the $(01:t_{n+1})$ state is drawn with a solid line whereas that path through the $(00:t_n)$ state is drawn with a dotted line to show that it does not survive to time $t_{n+1}$. For the surviving path through state $(01:t_{n+1})$, the path metric is updated as $$PM(01: t_{n+1})=(PM(10:t_n)+TM^1(10:t_n))$$

At the same time, $H(01:t_{n+1})$ is recorded as $H(10:t_n)$.

Trellis decoder unit 52 can be implemented in two distinct embodiments. In one embodiment (suitable for a software implementation of the trellis decoder unit), $I(01:t_{n+1})$ is recorded as $I(10:t_n)$ In a second embodiment (suitable for a hardware implementation), the index values are not modified when processing symbols. The reason for the two different realizations is that the second embodiment involves less data movement and so will consume less power in a hardware implementation. In a software implementation, the history and index values can often be held in a single machine word and, in this case, both assignments are done in a single operation. The benefit of this process is that the computation of the table to be passed to the history tracker and merger unit 53 is slightly simpler.

In either embodiment, the paths through the other states are handled analogously. Likewise, in a decoder with more states (e.g., the IS-95 decoder with 256 states), the operation is exactly the same for each state. As will be clear to those skilled in the art of Viterbi decoders, it is possible to conserve memory in the trellis decoder unit and simplify computations by operating on pairs of states together so as to update the path metrics, history and (in the case of the first embodiment) index values for the two states at the same time, keeping the same memory locations. This implies that the data associated with a given state moves from one location to another from one time interval to another; however, at the end of (constraint_length−1) steps all of the data are back to their original locations. This observation considerably simplifies the production of the tables that are output to the history tracker unit.

Figure 8:
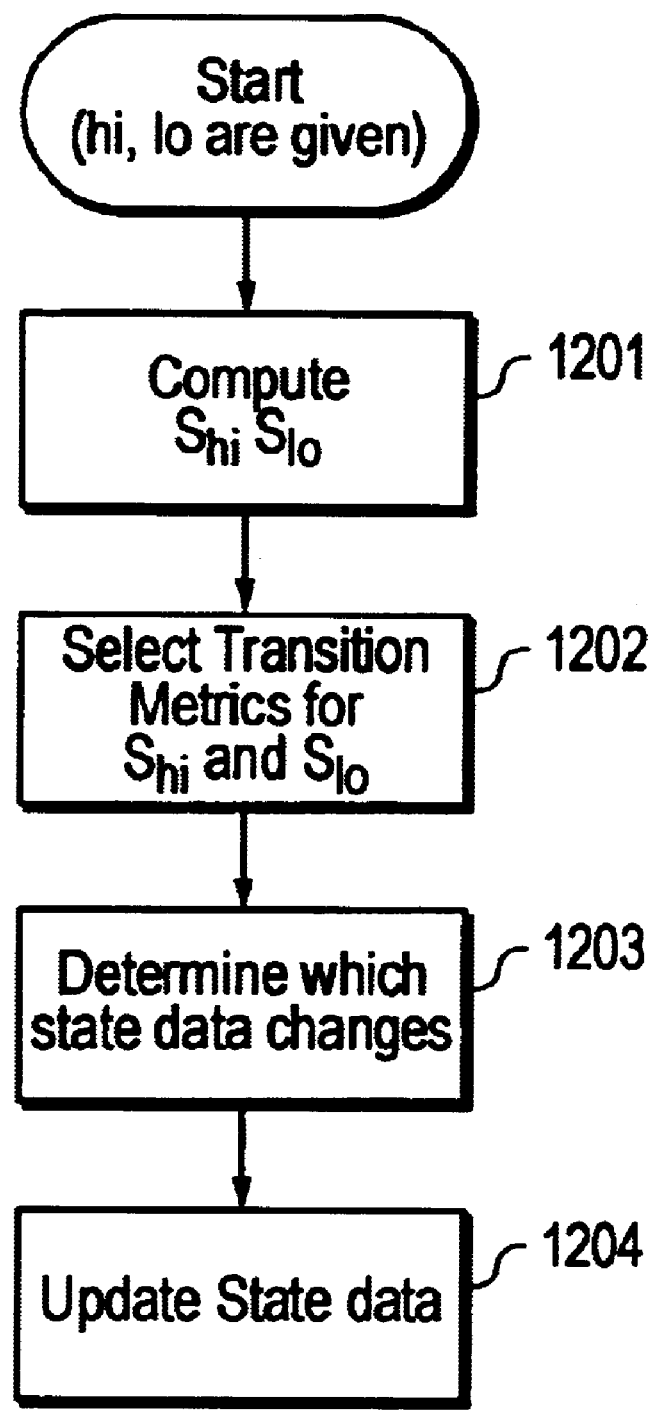
FIG. 8 illustrates how the files transferred to the history tracker and merger unit by the trellis decoder for a four state decoder for convolutionally encoded symbols are generated according to the present invention.

Each time a table of metrics arrives, the trellis decode unit must update the state information (i.e., the path metric, history and, in the first realization, the index) for each state. These operations are most conveniently performed on pairs of states in what is called a butterfly operation. For example in a 256 state decoder, 128 butterfly operations are performed each time a table of metrics arrives (i.e., for each symbol). The state information resides at the two indices lo and hi in the tables of state information inside the trellis decode unit 52. Keep in mind that the states at these indices change from one time to the next so that the indices of the updated states will also be lo and hi. The states re-arrange themselves back to the original order after four rearrangements for the sixteen state decoder. In the case of the four state decoder, the original order is achieved after two successive re-assignments; in the case of the 256 state decoder, i.e., the IS-95 decoder, the original order is achieved after eight successive re-assignments. In addition, with these reassignments at each stage, much of the data movement required by the butterfly operation is avoided because the butterfly operation calls for history bytes to be simply copied to their previous location. Referring to FIG. 8, the butterfly operation is illustrated. The first step (1201) of the butterfly operation is to determine the states, $S_{hi}$ and $S_{lo}$, corresponding to the indices hi and lo. This determination is necessary in order to then establish the four transition metrics out of those two states which we will call TR(lo,lo), TR(lo,hi), TR(hi,lo) and TR(hi,hi) (for example, TR(lo,hi) is the transition metric associated with a transition from lo to hi) in step 1202. The path and transition metrics are needed to determine which paths will be extended (and how they will be extended). This identification of the surviving paths allows us to determine which history (and in the first embodiment, index) values will be updated in step 1203. There are four possibilities and these can be encoded as a number from 0 to 3. Specifically, (0) neither are updated; (1) lo is updated; (2) hi is updated; and (3) hi and lo are updated. The details of the updates are as follows.

(0) PM(lo)←PM(lo)+TR(lo,lo)

PM(hi)←PM(hi)+TR(hi,hi)

(1) PM(lo)←PM(hi)+TR(hi,lo)

PM(hi)←PM(hi)+TR(hi,hi)

H(lo)←H(hi) and in embodiment 1, I(lo)←I(hi)

(2) PM(lo)←PM(lo)+TR(lo,lo)

PM(hi)←PM(lo)+TR(lo,hi)

H(hi)←H(lo) and in embodiment 1, H(hi)←H(lo)

(3) PM(lo)←PM(hi)+TR(hi,lo)

PM(hi)←PM(lo)+TR(lo,hi)

H(lo)←H(hi) and in embodiment 1, I(lo)←I(hi)

H(hi)←H(lo) and in embodiment 1, H(hi)+H(lo)

The trellis decoder unit 52 maintains only a single copy of the path metric, index and history for each state, though these values change with time. Using the four state decoder as an example, after updating the path metrics, indexes and history data at time $t_{2n+4}$, the trellis decoder passes a table of data to the history tracker and merger unit 53 which will enable the unit to compute, for the paths that survive at time $t_{2n+4}$, the state $S_{2n}$ from the state $S_{2n+2}$. To describe the computation of this output data it is useful to simplify our notation. At time $t_{2n+4}$, the only information remaining in the trellis decoder relates to time $t_{2+4}$, so for simplicity we will not include the time. Also, the state information will be indicated as simply an index and not as a binary number. At time $t_{2n+4}$, the trellis decoder unit 52 incorporates three tables, $PM_k$, $I_k$ and $H_k$ where k takes values 0, . . . , 3. Only $PM_k$, $I_k$ and $H_k$ are used or modified in producing the output table, but for convenience let us denote by $\Pi_k$ the surviving path through state $S(k:t_{2n+4})$.

Recall that the path metrics are unsigned and that arithmetic relating to the path metrics is in all cases saturated. One consequence of this is that there is a maximum value for the path metric, MAX, which is characterized by having all bits equal to 1. A path with a metric of MAX is regarded as no longer surviving.

Consider the first realization in which the index values have been updated. For k=0, 1, 2, 3, $H_k$ is the state that the path $\Pi_k$ assumed at time $t_{2n+2}$. It is possible that $H_0$, $H_1$, $H_2$ and $H_3$ are all distinct, but in fact this will rarely be the case. More often there will be duplication, and an important aspect of producing the table to be transferred from the trellis decoder unit 52 is to remove these repetitions. For the purpose of illustration, suppose that $H_0$, $H_1$ and $H_2$ are distinct values, that $PM_1$=MAX and that $H_2$=$H_3$. In this example, it necessarily follows that $I_2$=$I_3$, and that the trellis decoder unit will pass a table to the history tracker unit that has but two entries. In fact, it can pass the table:

| | |
|---|---|
| $H_0$ | $I_0$ |
| $H_2$ | $I_2$ | and in this case, the index table will be revised to the values $I_0=0$ and $I_2=I_3=1$ (to serve as an index into the table). Likewise, it could just as well pass the table:

| $H_2$ | $I_2$ |
|---|---|
| $H_0$ | $I_0$ | and revise the index table to the values $I_0=0$ and $I_2=I_3=0$. In either case, the history table is updated to the values $H_0=0$, $H_1=1$, $H_2=2$ and $H_3=3$ before the next symbol is processed.

In the second embodiment in which the index values have not been updated, we again observe that for k=0, 1, 2, 3, $H_k$ is the state that the path $\Pi_k$ assumed at time $t_{2n+2}$. It is possible that $H_0$, $H_1$, $H_2$ and $H_3$ are all distinct, but in fact this will rarely be the case. More often there will be duplication, and an important aspect of producing the table to be output from the trellis decoder unit is to remove these repetitions. For the purpose of illustration, suppose that $H_0$, $H_1$ and $H_2$ are distinct values, that $PM_1=MAX$ and that $H_2=H_3$. In this example, it necessarily follows that $I_2=I_3$, and that the trellis decoder unit will pass a table to the history tracker unit that has but two entries. In fact, it can pass the table:

| $H_0$ | $I_{H_0}$ |
|---|---|
| $H_2$ | $I_{H_2}$ | and in this case, the index table will be revised to the values $I_0=0$ and $I_2=I_3=1$ (to serve as an index into the table). Likewise, it could just as well pass the table:

| $H_2$ | $I_{H_2}$ |
|---|---|
| $H_0$ | $I_{H_0}$ | and revise the index table to the values $t_0=0$ and $I_2=I_3=0$. Whichever of these two tables is transferred to the history tracker and merger unit 53, the history table is updated to the values $H_0=0$, $H_1=1$, $H_2=2$ and $H_3=3$ before the next symbol is processed.

More generally, for a decoder with $N=2^B$ states, the tables will be output at times $t_{(Bn+2B)}$ and those tables will have up to N pairs of B-bit numbers. Specifically, the IS-95 decoder will output tables of up to 256 pairs of 8-bit numbers at times $t_{(8n+16)}$. Notice that for this decoder the first table is output only after sixteen symbols have been processed. Notice also that the right-hand side of each entry of the first table is 0.

In the history merger and tracker unit, the object is to determine the most probable path through the multiplicity of states and transitions. The path determines a sequence of states. When each state is determined, the logic signals that generate that state are generally the logic signals that were originally transmitted. Then the transmitted logic signals are determined, the sequence of logic signals that was applied to the convolutional encoder can be determined.

Figures 9A, 9B:
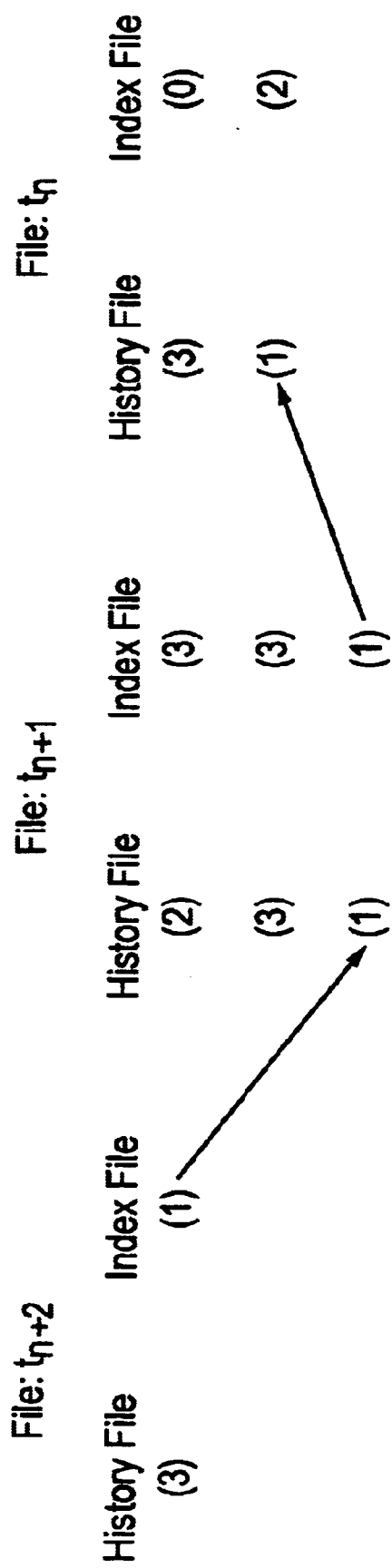
FIG. 9A illustrates a format for files maintained for a plurality of symbols received by the decoder unit for a two state convolutional encoder, while FIG. 9B identifies the path that is illustrated by the files according to the present invention.
Figures 10A, 10B:
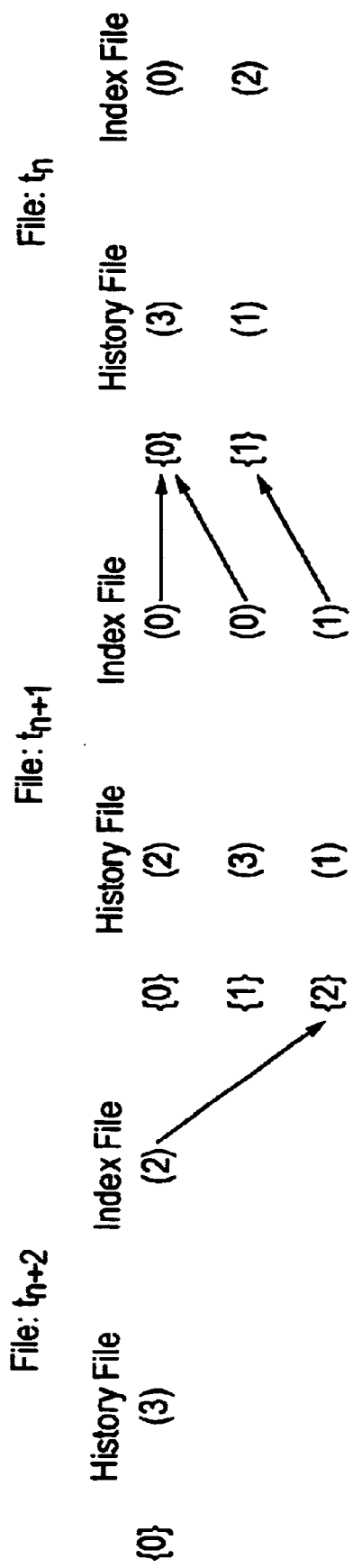
FIG. 10A illustrates a second format for files maintained for the same plurality of symbols illustrated in the FIG. 9A, while FIG. 10B identifies the path that is illustrated by the files according to the present invention.

The operation of the two pointer-indexes is illustrated in FIG. 9A, FIG. 9B, FIG. 10A and FIG. 10B. In this procedure, the history files transferred from the trellis decoder remain the same, as seen by FIG. 9A and FIG. 10A. However, the index files in FIGS. 9A and 10A are different. As shown in FIG. 9A, an index entry points to a history entry in the previous file set. However, as shown in FIG. 10A, in brackets, an index entry points to an address (in brackets) in the previous history file. The index files in the first chronological file are the same as in FIGS. 9A and 10A and are the starting state for the sequence of files. As illustrated in FIGS. 9B and 10B, the same binary number sequence is provided as a result of the following (backtracking) the path through the transferred files.

Figure 11A:
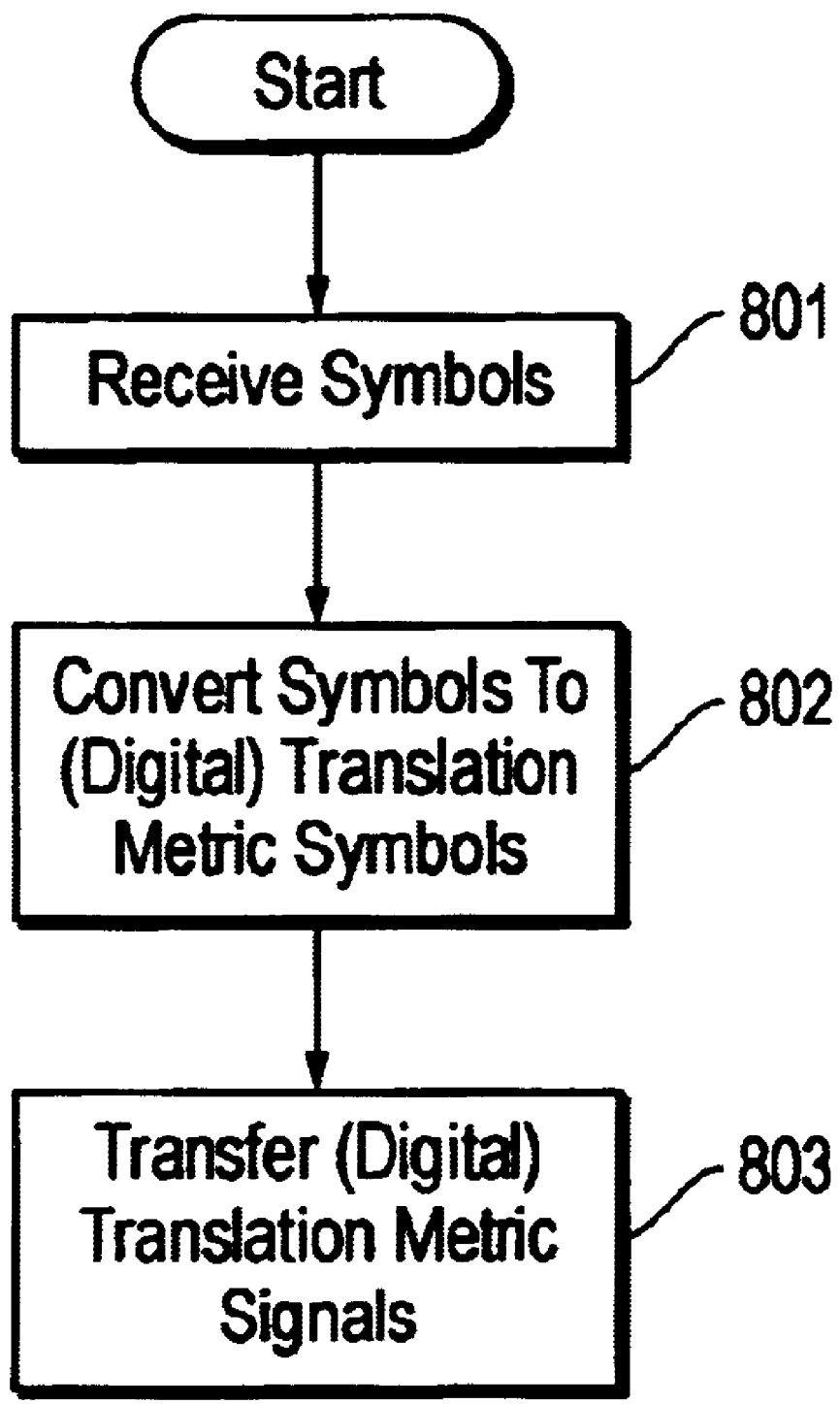
FIG. 11A is a flow diagram illustrating the operation of the metric server.
Figure 11B:
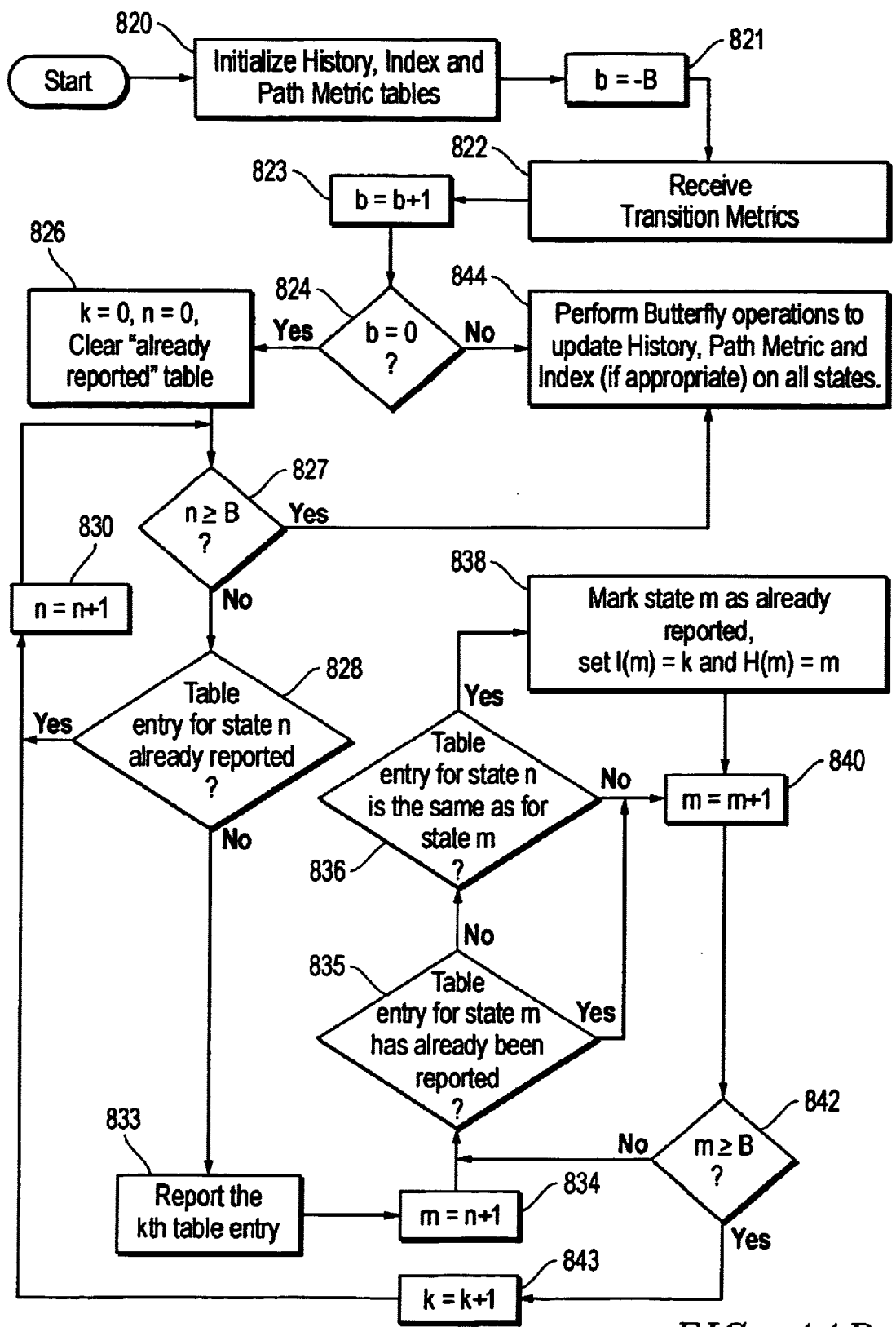
FIG. 11B is a flow diagram of the operation of the trellis decoder unit.
Figure 11C:
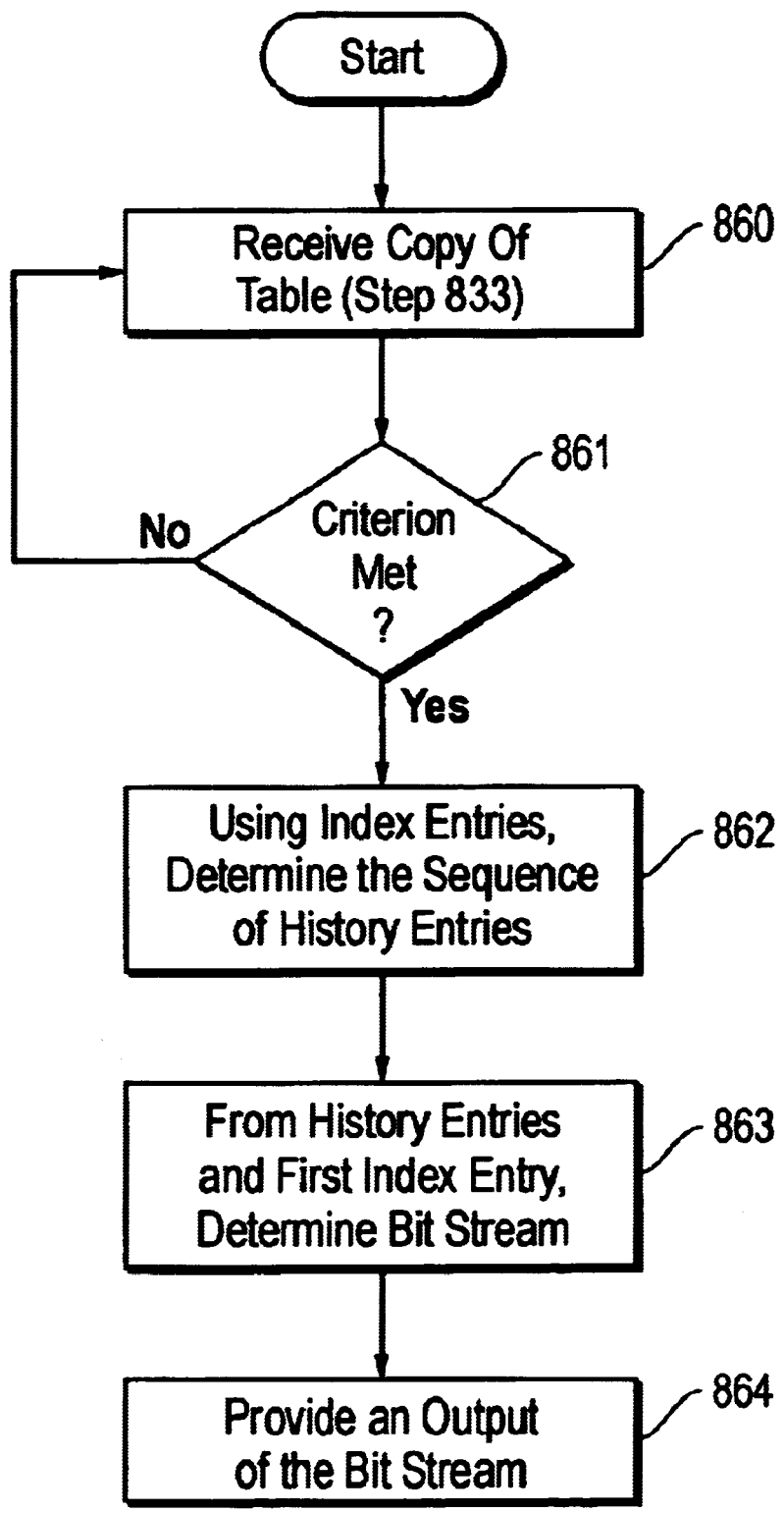
FIG. 11C is a flow diagram illustrating the operation of the metric tracker and server unit, according to the present invention.

FIG. 11A, FIG. 11B, and FIG. 11C provide flow charts illustrating the operation of portions of the invention. Referring now to FIG. 11A, the operation of the metric server is illustrated. In step 801, the metric server unit receives the transmitted encoded signals, generally referred to as symbols from the channel. In step 802, the symbols are converted to digital quantities referred to as transition metric signals. The transition metric signals are then transferred, in step 803, from the metric server unit 51 to the trellis decoder unit 52. The transition metrics are associated with a state. As will be clear to those familiar with "soft decision" Viterbi decoders, a conditional decision is made for each possible value of the most recent B bits (i.e., each possible state). In the trellis decoder then, in considering each state k, the most recent encoded bits are assumed to be described by the state number k. With this understanding, the two expected symbols are known to correspond to an uncoded logic "0" bit or/and uncoded logic "1" bit. The transition metrics at state k are, therefore, the differences between the actual received symbol (with its noise) and each of the two symbols (no noise) that the encoder would have provided as output under these alternatives. These two selections, as a function of state, can be computed once given the convolutional codes of the encoder.

Referring now to FIG. 11B, the operation of one implementation of the trellis decoder is illustrated. In step 820, the history table, the index table and the path metric table are initialized. The symbol variable b is set equal to −B in step 821. In step 822, the transition metrics are transferred from the metric server to the block trellis decoder. In step 823, the variable b is incremented to the value b+1. In step 824, a determination is made whether the variable b=0. If b=0 in step 824, the table entry variable k is set to k=0, state variable n is set to n=0, and the "already reported" table is cleared in step 826. A determination is made whether $n \geq B$ in step 827. When, in step 827, n is not $\geq B$, a determination is made whether the table entry for state n has already been reported in step 828. When the determination in step 828 is made that the entry table for state n has already been reported, then the procedure continues to step 830 wherein the variable n is incremented to n+1. From step 830, the procedure returns to step 827. When, in step 828, a determination is made that the table entry for state n has not already been reported, then in step 833 the kth table entry is reported. In step 834, the variable m is set equal to n+1. In step 835, a determination is made whether the table entry for the mth state has been reported. When in step 835, a determination is made that the table entry for state m has already been reported, then m is set equal to m̂+1 in step 840. When a determination is made in step 835 that the table entry for state m has not already been reported, then a determination is made whether the table entry for state n is the same and the table entry for state m in step 836. When in step 836 the table entry for state n is not the same as the table entry for state m, then the decision proceeds to step 840. When the decision is made in step 836 that the table entry for state n is the same as the table entry for state m, then the state m is marked as already reported, I(m) is set=k and H(m) is set=m in step 838. The procedure then returns to 840 where m is set equal to m+1. In the step 842, a determination is made whether m≧B. When m is not ≧B in step 842, then the procedure goes to step 835. When m≧B, then the variable k is set equal to k+1 in step 843. From step 843, the procedure goes to step 830. When n≧B in step 827 or when b≠0 in step 824, then in step 844, butterfly operations are performed to update the history entries, the path metric entries and index entries (if appropriate) for all states. Then the procedure returns to step 822 wherein the transition metrics are transferred from the metric server unit to the trellis decoder unit.

Referring now to FIG. 11C, the activity of the history tracker and merger unit depends on the transfer of the tables created in the trellis decoder unit, and has a counter part to step 833 of FIG. 11B in step 860 of FIG. 11C. In step 861, a determination is made whether a preselected criterion is met by the transfer of the table to the history and tracking unit. For example, one possible criterion is the transfer of a single history table in step 860. Another possible criterion which has been mentioned previously is the reduction of available memory space to an unacceptable level. A third possible criterion is that a history table of sufficiently small size is received (e.g., with only one entry) from the block trellis unit. When the criterion is not met in step 861, the process returns to step 860 to await the next transfer of a table. When the criterion is met in step 861, in step 862, the sequence of history entries forming a path from the last history entry is determined through the use of the index entries to provide a pointer to a history entry in the next earlier table transferred to the history merger and tracking unit in step 863. In step 864, from the sequence of history entries, a decoded bit sequence can be determined and this bit stream sequence can be provided as an input, after decoding and restoration of the signals, to an output device.

Figure 12:
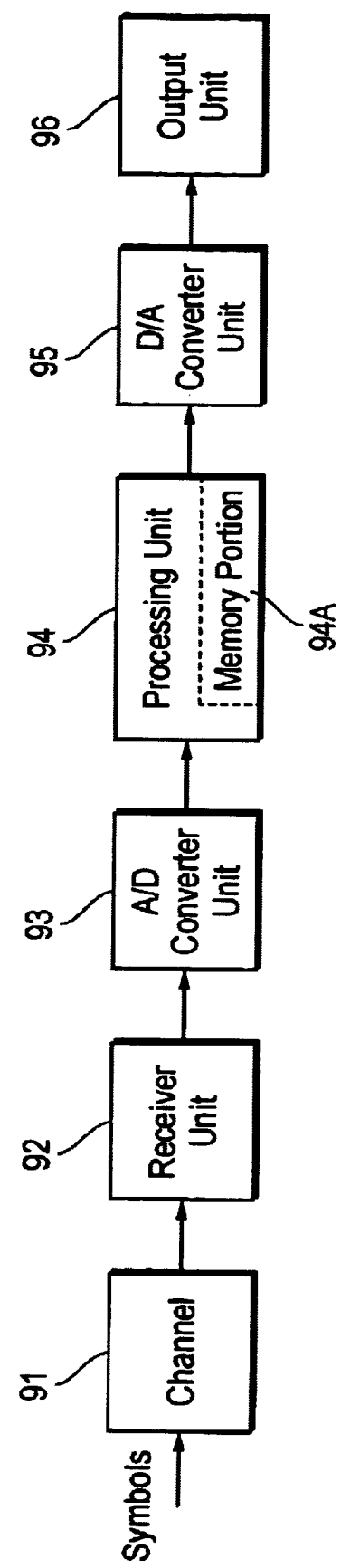
FIG. 12 illustrates one communication system incorporating the present invention.

Referring to FIG. 12, an implementation of the present invention is illustrated. The encoded symbols are transmitted through channel 91, the channel possibly introducing noise to the symbols, and applied to a receiver unit 92. The receiver unit 92 can, for example in the case wireless transmission, include an antenna and an amplifier. The signals from the receiver unit 92 are applied to analog/digital (A/D) converter unit 93, the A/D converter unit providing output signals in the form of digital magnitudes. The output signals from the A/D converter unit 93 are applied to processing unit 94. The processing unit 94 can be implemented by a hardwired processing unit, a processing unit processing signals entirely under the control of the software program, i.e., stored in a memory portion 94A, or a combination of hardware and software implementations. As a result of the processing in the processing unit 94, a decoded signal bit stream of signals can be provided (for example in the example of encoded voice information to digital-to-analog (D/A) converter unit 95. A/D converter unit 94 can apply signals to an output unit 96, e.g., loudspeaker.

Figure 13A:
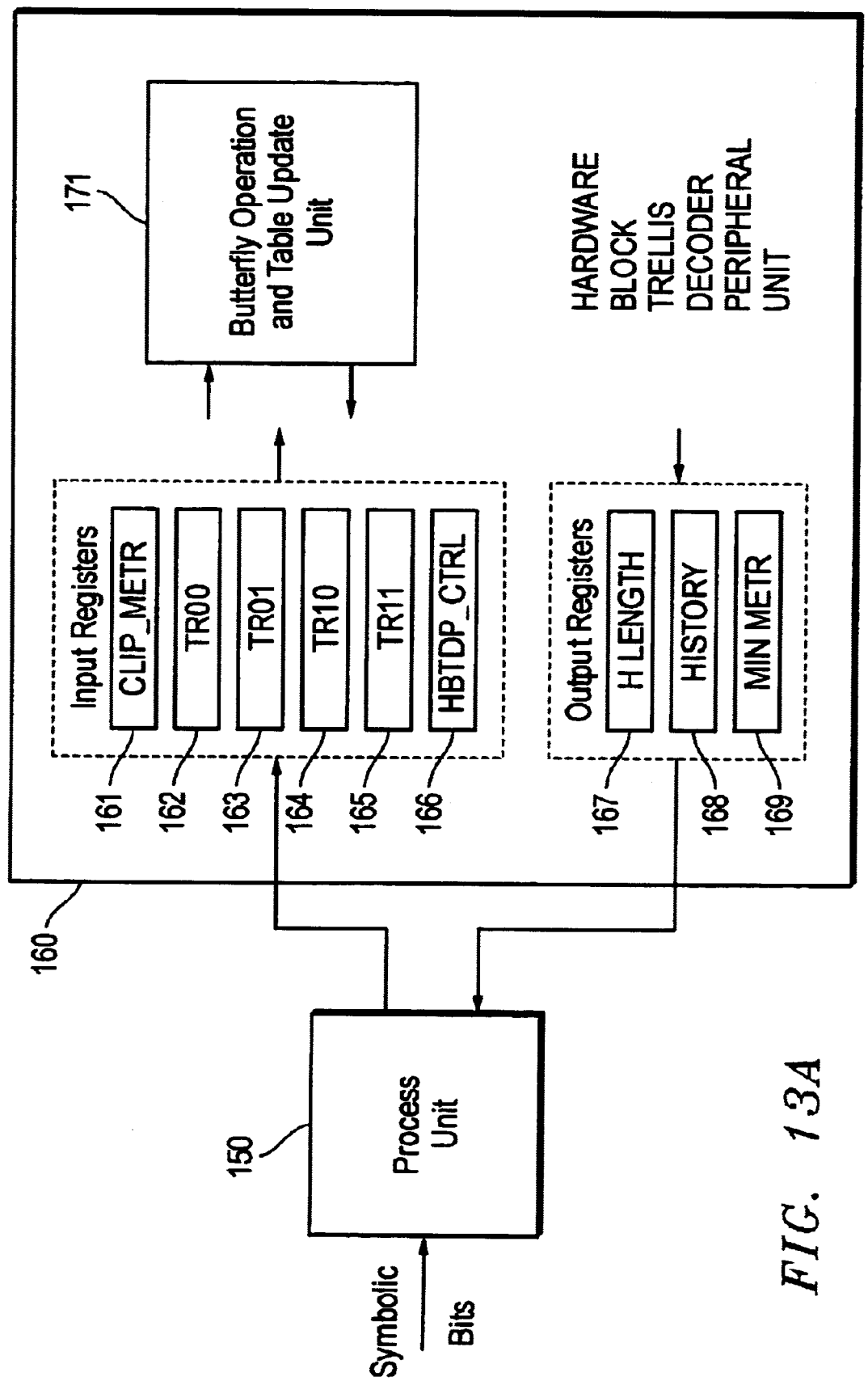
Figure 13B:
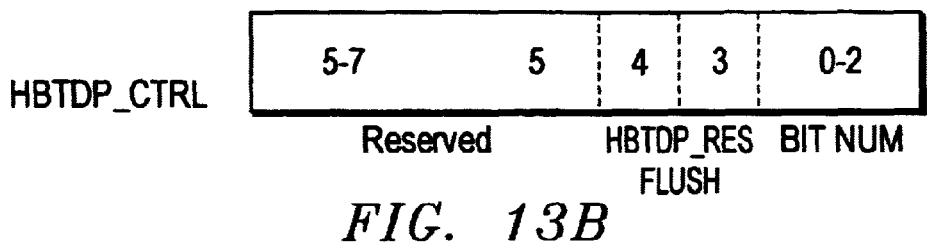
FIG. 13B, FIG. 13C and FIG. 13D illustrate data formats for selected registers in FIG. 13A.

Referring to FIG. 13A, one embodiment of the block trellis decoder for decoding convolutionally-encoded symbols implemented in hardware is shown. This embodiment of the block trellis decoder will be called hereinafter as hardware block trellis decoder (HBTD) 100 unit. This HBTD unit 100 includes a processor unit 150 and hardware block trellis decoder peripheral (HBTDP) unit 160. The HBTDP unit 160 can be described as a memory mapped peripheral unit operating under control of a processor unit 150, e.g. a DSP unit or a general-purpose processor unit. In FIG. 13A, only the interface registers 161–169) of the HBTDP unit are shown to illustrate the operation of the HBTD unit 100. The HBTDP unit 160 includes a CLIP\_METRIC register 161 that can be a 16-bit register. From the perspective of the processor unit 150, the CLIP\_METRIC register 101 can be a write-only register. At power-up of the HBTD unit 100, the processor unit 150 assigns an unsigned value to the register. The value in the CLIP\_METRIC register 161 is the highest value of the path metric that can be transferred. Register 161, therefore, improved the operation of the decoder by eliminating paths with path metrics of such a high value that these paths can be discarded are of no interest, The HBTDP unit 160 also includes five 8-bit memory mapped registers, a TR00 register 162, a TR01 register 163, a TR10 register 164, a TR11 register 165, and a HBTDP\_CTRL register 166. The processor unit 150 must be able to write to these registers, but it is not essential that the processor unit 150 read these registers. An unsigned transition metric is transferred to each of the TR00 register 162, the TR01 register 163, the TR10 register 164, and the TR11 register 165. A control word is written into the HBTDP\_CTRL register, the control word consisting of a BITNUM field (( )–2), A FLUSH field (3), a HBTDP field (4), and a reserved field (5–7). These fields are illustrated in FIG. 13B.

In operation, the processing of the butterfly operations, the storage of tables and the apparatus for updating the tables performed in the butterfly operation and table update unit 171. The four transition metrics (corresponding to a single convolutionally encoded bit) are loaded to their respective registers. Then, the HBTDP\_CTRL register 166 is written into, causing the HBTDP unit 160 to update its internal state. When the HBTDP\_RES field is set, the internal state is set to its initial conditions, and then the HBTDP unit 160 updates its internal state. This updating will occur only when the BITNUM field is zero. When the FLUSH bit field is set, the HBTDP unit 160 updates its internal state assuming that the current bit is a tail bit (in the framed mode). The FLUSH bit will never be set for continuous bit decoding. In successive writes to the HBTDP\_CTRL register 166, the BITNUM field takes (assuming a block size of 8) the values 0, 1, 2, 3, 4, 5, 6, 7, 0, 1, . . . etc. Although the HBTDP unit 160 itself could compute the BITNUM field, this field is included in the HBTDP\_CTRL register 160 to accommodate error checking and to ensure synchronization of the HBTDP unit 160 with the processor unit 150. When the HBTDP unit 160 detects a violation of the intended sequence of values, the violation can be reported to the processor unit 150.

Figure 13C:
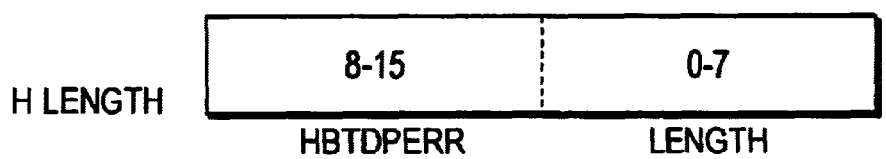

The HBTDP unit 160 has three 16-bit unsigned output registers, the HLENGTH register 167, the HISTORY register 168, and the MINMETR register 169. The output registers are read by the processor unit 150 each time after the HBTDP\_CTRL field has a BITNUM=7 written therein (i.e., every eight bit). Referring to FIG. 13C, the HLENGTH register 167 stores two fields, an 8-bit LENGTH field (i.e., bits 0–7) and an 8-bit HBTDERR field (i.e., bits 8–15). The HBTDP unit 160 sets the HBTDERR field to a code that indicates the kind of error encountered while processing the most recent eight bits, the value HBTDERR=0 indicating no error. HLENGTH=0xFFFF indicates that the HBTDP unit 160 is busy and that the processor unit 150 should wait in a delay loop or wait for an interrupt procedure. The code HBTDPERR=0xFF should be used only with HLENGTH=0xFFFF.

Figure 13D:
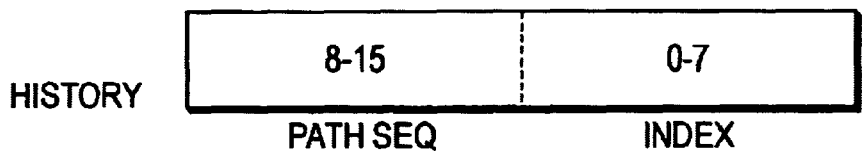

The HBTDP unit 160 sets the LENGTH field to an unsigned integer value (in the range of 0–255). This field represents the number of data values that the processor unit 150 should read from the HISTORY register 168. Referring to FIG. 13D, the HISTORY register 168 includes an INDEX field for bits 0–7 and a PATH\_SEQ field for bits 8–15. The intention is that the processor unit 160 will read the HISTORY register 168 the number of times indicated in the HLENGTH field when the HBTDPERR field is zero. The processor unit 150 will then save the data from the HISTORY register 168 in the memory of the processor unit 150. If the processor unit 150 does not perform the expected number of read operations, The HBTDP unit 160 should report this (as a code in the HBTDPERR field) the next time that the HBTDP unit 160 reports to the processor unit 150.

The HBTDP unit 160 sets the MINMETR field to a 16-bit unsigned number that is needed only in a framed decoding mode.

When the HBTDP unit 160 is finished processing a group of eight bits and, consequently, has output data to be transferred to the processor, an interrupt to the processor unit 150 is initiated. In preparation for the transfer of data, the HLENGTH field is set to an appropriate value other than 0xFFFF. This use of the HLENGTH field provides the means for either a polling service or an interrupt service of output data from the HBTDP unit 160.

A table of path metrics is maintained by the HBTDP unit 160, one for each of the 256 states of the decoder. No need can be found for a user to access these tables directly. However, access to the internal registers of the HBTDP unit 160 may be useful either for diagnostic purposes or for unforeseen operational reasons. While permitting read access to these tables is harmless, permitting a write access provides the possibility of accidental corruption of the path metric values.

With respect to the error conditions, the system should be such that HBTDP unit 160 errors do not occur in field operation. During system development, however, HBTDP unit 160 errors will undoubtedly occur. These errors are reported in the HBTDPERR field of the HLENGTH register. Typical error conditions are indicated in Table 1.

TABLE 1

| HBTDPERR | Condition |
| --- | --- |
| 0x00 | Output ready, no error |
| — | Full output not read for preceding eight-bit group. HBTDP_RES clears this error |
| — | Bit order error Correct sequence of values for BITNUM field was not followed |
| 0xFF | Output not ready. Always occurs with LENGTH = 0xFF |

Whenever the HLENGTH field is read, the error condition should be cleared. As a result, a single error event will be reported only once. However, the single reporting does not indicate that the error condition has been resolved. Of course, the field HLENGTH=0xFF will continue to be reported until the data is ready.

Figure 15:
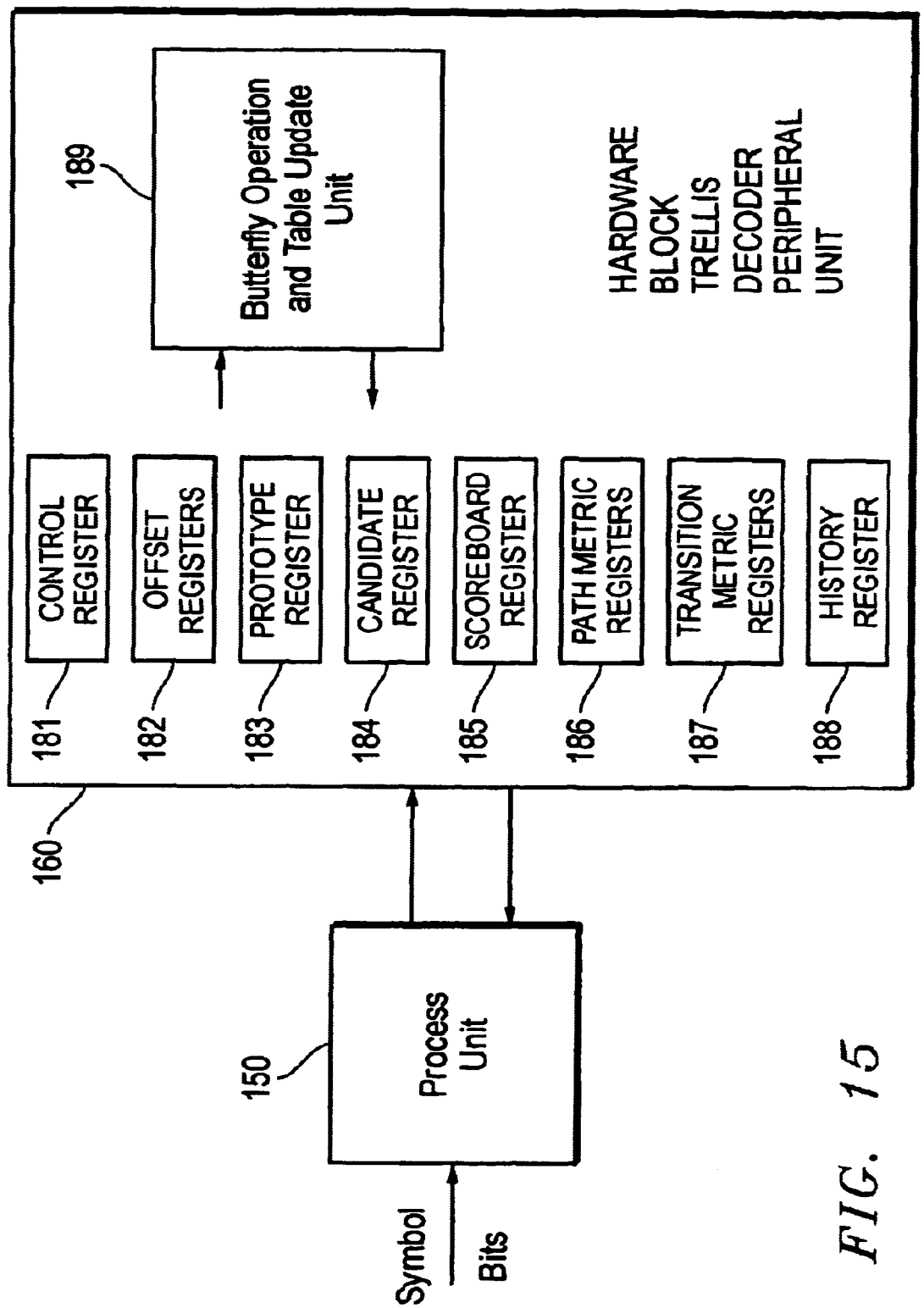
FIG. 15 is a block diagram of a second embodiment of the hardware block trellis decoder according to the present invention.

Referring to FIG. 15, a second embodiment of the block trellis decoder unit 110, with a block trellis decoder peripheral (HBTDP) unit 180 implemented in hardware, that can provide expedited computations is shown. This embodiment of the block trellis decoder unit of FIG. 5 includes a processor unit 150, typically a digital signal processing unit, and a hardware block trellis decoder peripheral (HBTDP) unit 180. The processor unit 150 performs the functions of the metric server and of the merger and tracker unit for the block trellis decoder unit. The interface between the HBTDP unit 180 and the control unit 150 is performed by group of registers 181 through 188. The registers include a control register 181, an offset register 182, a prototype register 183, a candidate register 184, a scoreboard register 185, path metrics registers 186, transition metric registers 187, and history registers 188. The control register 181 is a single register accessed by single address. A read operation or a write operation involving this register will provide codes that are described in more detail with reference to Table 2. The offset register 182 is a single register at a single address. A sixteen bit unsigned integer is written to this address and will be added to any address subsequently read from the prototype register 183 or the candidate register 184. The prototype register 183 is a single register accessed by a single address. A read of the prototype register 183 accesses an address. The candidate register 184 is a single register accessed by a single address. The candidate register 184 also stores an address. The scoreboard register 185 is a single register accessed by a single address. The path metric register 186 is a single register accessed by a single address. The transition metrics registers 187 are a block of registers of the width of transition_metrics. The block of registers includes 32 registers, 8 groups of 4 registers so that the transition metrics for the entire group of symbols can be stored. 4 registers for each block of transition metrics. And the history registers 188 is a block of 256 registers, each register being 16 bits wide. The upper eight bits of each register represents eight decoded bits (actually, as will be discussed below, candidates for decoded bits) and the lower eight bits point to a table entry that the processor unit maintains. The butterfly operations and table update unit 189 performs the butterfly operations on the transition metrics and updates the tables in a manner that has been described above.

The operation of the HBTDP unit 180 can be understood as follows. The purpose of the HBTDP unit 180 is to accelerate the butterfly computations. Consequently, the interface registers serve to provide the transition metrics to the HBTDP unit 180 and to receive from the HBTDP unit 180 the partially decoded paths in the form of the history register fields. The partial paths determined by the HBTD unit 110 will be referred to hereinafter as trails.

The control register 181 both controls and supports the overall state of the HBTDP unit 180. In the preferred embodiment, three different codes can be written in the register and five codes can be read. The codes are summarized as shown in Table 2.

TABLE 2

| Read from the Control Register | Write to Control Register |
| --- | --- |
| BUTTERFIES_DONE (193) | RESET_ALL |
| INITIALIZED (191) | RUN_BFLY |
| RESET_IN_PROGRESS (190) | RUN_FLUSH |
| BFLY_IN_PROGRESS (192) | |
| TRAIL_IN_PROGRESS (194) | |

The numeric values for these codes are not specified, but they are listed in increasing order and this order is useful for making the DSP software more efficient. For example, when a value ≦INITIALIZED is read, then the HBTDP unit 180 is waiting for the processor unit 150 to issue a command. The processor unit 150 can read the control register 181 to determine the state of the HBTDP unit 180 and can write to the control register 181 to alter the state of the HBTDP unit 180. The relationship of the control register 181 to the state of the HBTDP unit 180 is summarized in FIG. 16. Each of the states of the HBTDP unit 180, as indicated by the "Read from Control Register" codes in Table 1, are disclosed in oval figures, while the codes that transfer the machine from one state to the next are shown beside the transition paths in FIG. 16. The states of the machine have the same labels (and numeric designations) in FIG. 16 as the "Read" entries Table 2.

In order to initialize the HBTDP unit 180, the command RESET_ALL is entered in the control register 181. This command should be entered in control register 181 at power up and prior to the start of each frame, i.e., a frame being the group of symbols/path metrics processed as a unit. The RESET_ALL command results in the HBTDP unit 180 entering the reset_in_progress state 190. While in the reset_in_progress state 190 is present, the HBTDP unit 180 stores initial values to the history and the path metric arrays. During this initialization, the processor unit 150 should not enter any data in the command registers, i.e., the control register 181, the offset register 182, the prototype register 183, the candidate register 184 and the scoreboard register 185, or in the history registers 188 or to the path metric registers 186. However, entries can be made in the transition metric registers 187.

When the initialization is finished, the HBTDP unit 180 enters the INITIALIZED state 191 and the INITIALIZED code is entered in the Read portion of the control register 181.

When the processor unit 150 writes the RUN_BFLY code or the RUN_FLUSH code in the control register 181, the trellis butterfly operations are initiated. These codes cause HBTDP unit 180 to enter the butterfly_in_progress state 192. These codes should be entered in the control register 181 only after the 32 values are entered in the transition metric registers 187. The individual values entered in the transition metric tables are treated by the HBTDP unit 180 as unsigned data, the larger values representing the less likely transitions. The four transition metrics for each pair of received symbols are written in consecutive locations in the transition metric registers. The RUN_FLUSH code should be entered in the control register 181 only for the last trellis/butterfly operation in a frame. When the HBTDP unit 180 enters the butterfly_in_progress state 192, BUTTERFLY_IN_PROGRESS code is entered in the control register 181.

When the HBTDP unit 180 completes the butterfly computations for one block, HBTDP unit 180 enters the butterflies_done state 193, and the BUTTERFIES_DONE code is entered in the Read portion of the control register 181. A field in the prototype 183 results in the HBTDP unit 180 entering the trail_in_progress state 194.

Figure 17A:
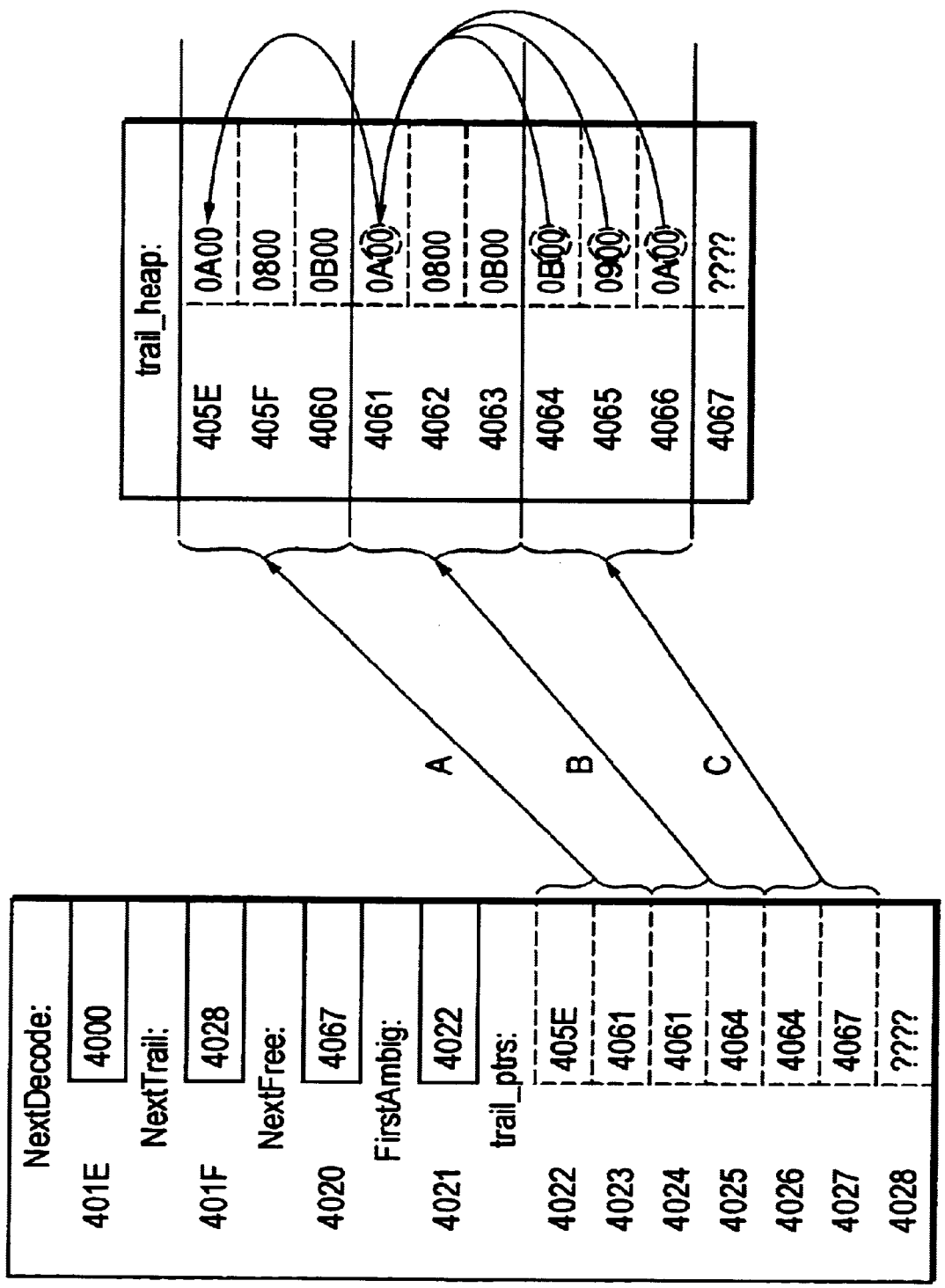

Instead of storing complete sets of history data, the processor unit 150 stores quantities that will hereinafter be called trails. Referring to FIG. 17A, three trails are illustrated. These trails are labeled A, B, and C and represent surviving paths from the butterfly operation. The first portion of the word is state address/decoded portion of the path while the second portion of the word is an index to one of the surviving paths identified by the previous pointer. The trail pointers (trail_ptrs) in data memory designate starting address and the fmal address of a trail member, each trail member having a word length. Trail C is the most recent trail as can be seen from the next trail (NextTrail) address. From this third trail, the three words indicate that the third decoded bytes/states can be 0B, 09, or 0A. However, because each of the three indexes for the three surviving paths are 00, the second decoded byte must be 0A. The index of the surviving state of the second byte is 00, then the decoded first byte must also be 0A.

Figure 16:
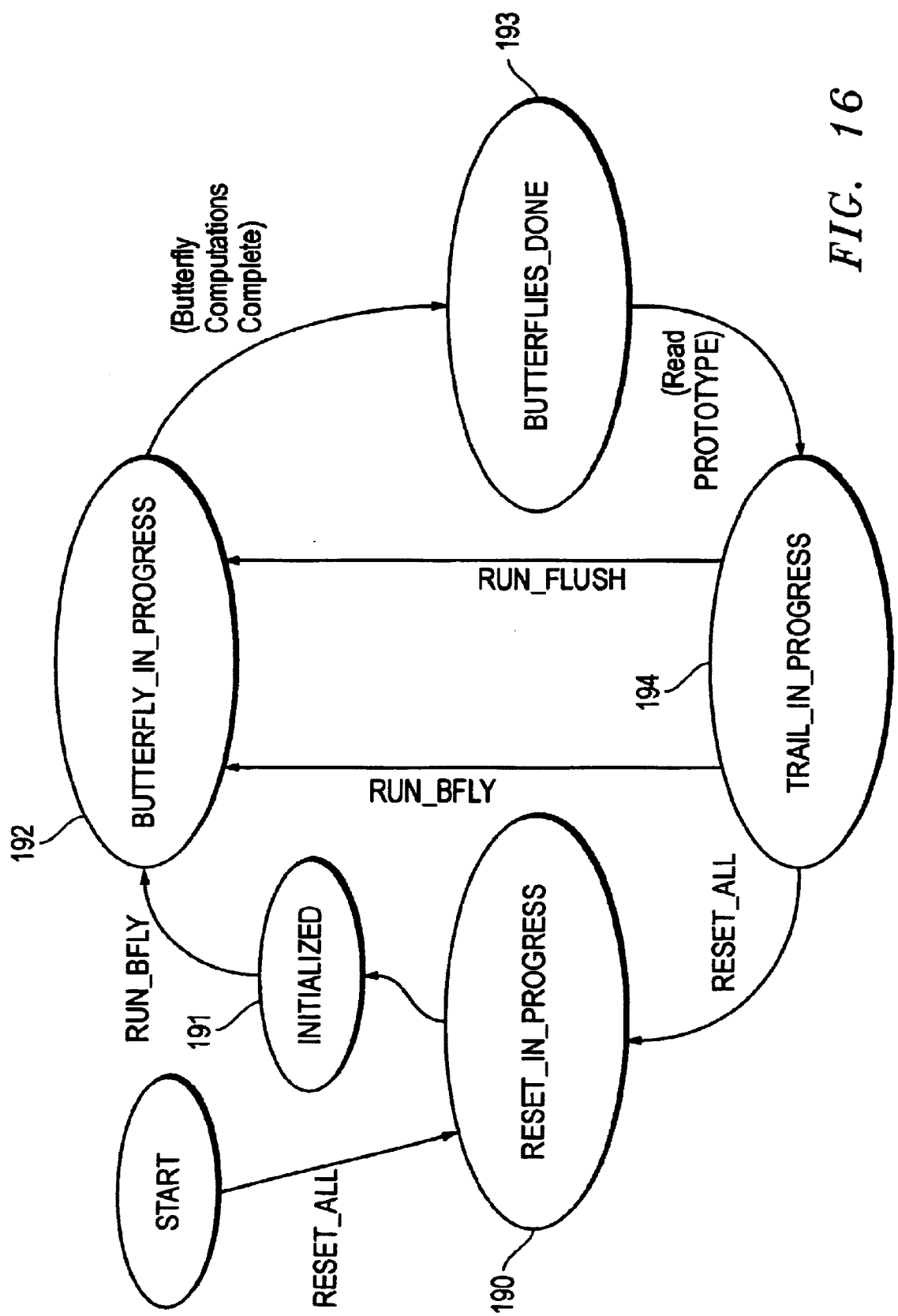
FIG. 16 is a state diagram of the second embodiment of the hardware block trellis decoder of FIG. 15.

The HBTDP unit 180 and the processor unit 150 must cooperate to store the data as shown in FIG. 16. The HBTDP unit 180 determines the trails in a less compact format. For example, trail B in FIG. 17A can be represented within the HBTDP unit 180 as the file shown in FIG. 17B. Note the many redundant copies of each word. (For purposes of example, the file in FIG. 17B has word 16 entries whereas for an IS-95 protocol, the file in FIG. 17B would contain 256 entries. Also, in this example, the low order byte of each word is 0. The 0 value is an accidental occurrence of this example and, in practice, different values would be found.)

The history register array 188 is part of the interface between the processor unit 180 and the HBTDP unit 180, but this interface is not sufficient for transferring trail information. In order to provide a sufficient interface, three additional codes called prototype, candidate, and offset are transferred to the memory portion of processor unit 150. The prototype register 183, candidate register 184, offset register 182 and the history registers 188 constitute a trail production interface. In using this interface, the prototype register 183 and the candidate register 184 can have fields both be written therein and retrieved therefrom. As writes occur during the trail production, the quantities stored in the history registers 188 will change. The processor unit 150 must therefore make an initial copy of the history registers 188 to preserve the initial values. The starting location in memory used to store this initial copy is written to the offset register 182. The HBTDP unit 180 then adds this offset value to the values that are read from the prototype register 183 and candidate register 184.

The HBTDP unit 180 reads the contents of the prototype register 183 to obtain the address of the word to be added to the trail. Since the offset has been entered as described above, the address that will be returned in the prototype register 183 is the address of the word in the (initial) address file that unit 150 has stored in its memory. The processor unit 150 places this word in the trail that it is creating. The processor unit 150 should then write to the prototype register 183 the offset in that trail. In the example of FIG. 17A, a 0 is written to the prototype register by the processor unit 150 after reading the address of 0a00 from the prototype register 183 and a 1 is written to the prototype register 183 after reading the address of the word 0800 from the prototype register 183. When the processor unit 150 reads an address from the prototype register that is >(256+offset value), no additional prototype values are left to be processed. In fact, once the processor unit 150 starts reading the prototype register 183, the processor unit 150 must (for the correct operation of the HBTDP unit 180) continue until this value is reached.

Each time HBTDP unit 180 obtains the prototype-derived word to place in the trail, the HBTDP unit 180 must search the (initial) copy of the history table for other instances of that word. The HBTDP unit 180 assists in this search by reporting candidates to the processor unit. This reporting of addresses by the candidate register 184 uses the same conventions as does the prototype register 183 when transferring addresses. The processor unit 150 determines the address of a candidate by reading the candidate register 184 to obtain the address of a candidate, comparing the candidate word with the word obtained by the address of the prototype register 183, and determine whether the two words are the same. If in fact the word obtained from the prototype register address and the word obtained from the candidate register address are the same, then the processor unit 150 must communicate this fact to the HBTDP unit 180 by writing the corresponding trail offset to the candidate register 184. The benefit to the HBTDP unit 180 of performing this transfer is that it will not thereafter have to consider this entry as a future candidate. Another benefit is that the HBTDP unit 180 will decode properly.

No transfer of information (including history register data) that would lead to the production of the trail is generated at the end of the processing of the first group of (8) symbols. The first group of history data is transferred at the end of the processing of the second group of symbols. Because the control unit is by-passing the normal trail production sequence, the processor unit 150 prepares the HBTDP unit 180 for the next occurrence of the butterflies__ in__progress state by storing an n in each element of the history register array 188 in the HBTDP unit 180.

Figure 17C:
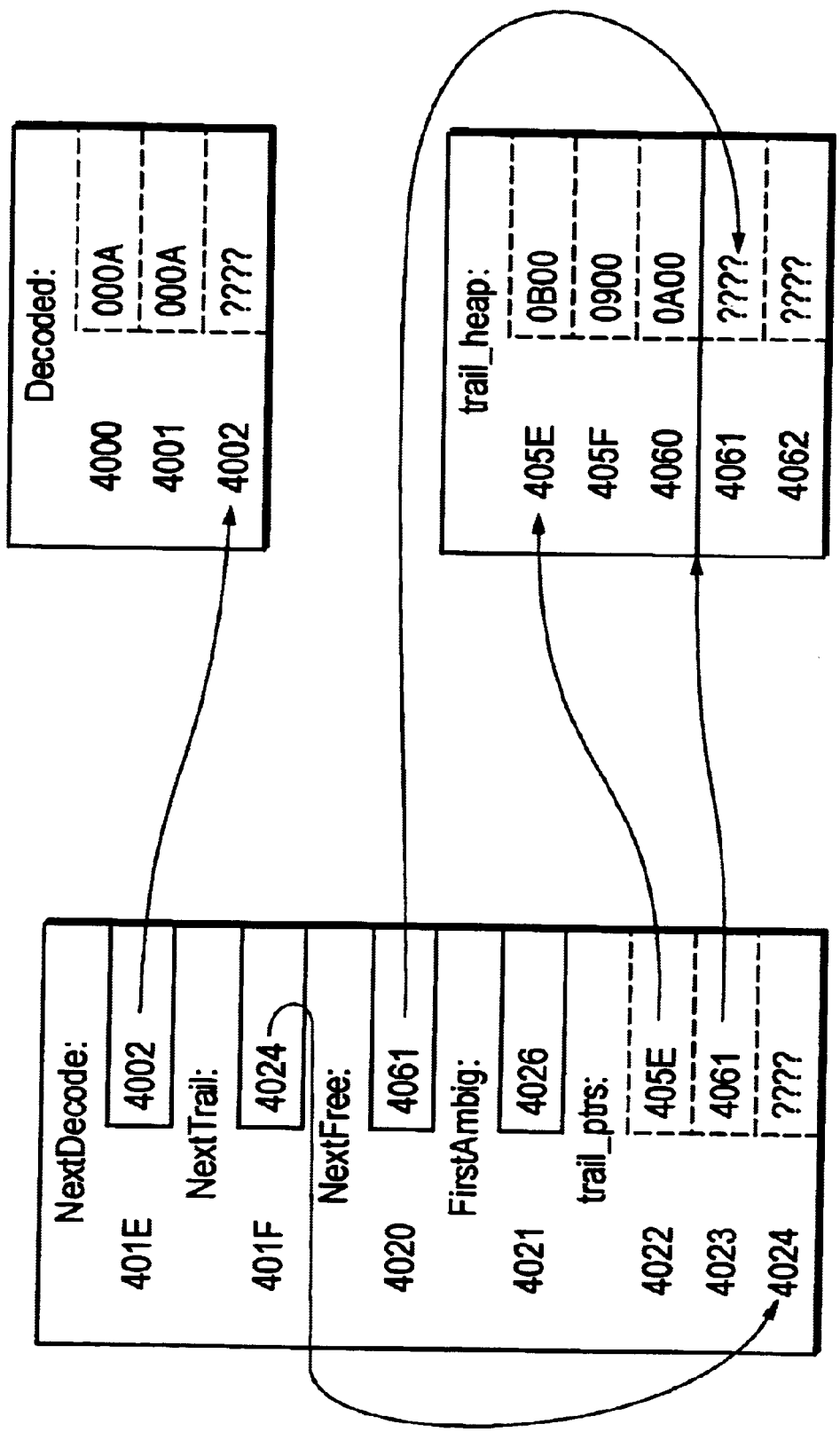

In order to support the trail production operation described above, the HBTDP unit 180 suggests prototype and candidate addresses. This function is performed by maintaining a register with 256 bits, each bit indicating whether a corresponding address is still the address of a candidate or the address of a prototype. This register is called the scorecard register 185 in FIG. 15. In essence, this register is searched for the first-bit-set and the corresponding address is reported. For the processor unit 150 to perform a similar operation, an array of 256 words of 16-bit random access memory (RAM) would be needed. The actual search of the array would require an additional apparatus and would require addition operational cycles. Because the HBTDP unit 180 needs to perform such an operation, the scoreboard (interface) register 185 is provided so that the processor unit 150 can take advantage of the apparatus that is required by the HBTDP unit 180 in any event. The processor unit 150 needs these capabilities in order to compress the trail information as described above. Referring to FIG. 17C, the same information is presented as is found in FIG. 17A. However, the information from the first two trails has been placed in (decoded) memory locations 4000–4001. The memory locations 4024–4027 and 4061–4066 have been reclaimed as a result of the compression and are available for reuse during the decoding. The computation cost in performing the compression varies, but the computational cost is smallest whenever a short trail is constructed. Conversely, little memory space is likely to be recovered when there are few trails.

The simplest example of compression occurs when a trail has length 1. This compression is shown in FIG. 17A and consists of following the curved arrows on the right hand side of FIG. 17A backward and recording the high order bytes in the Decoded file. The procedure can be followed without support of the HBTDP unit 180.

The compression begins with the comparison of successive pairs of trails, starting with the most recently constructed trail and its predecessor. Each trail can be thought of as function whose range is a subset of the preceding trail. For example, in FIG. 17A, each trail maps to the zero'th element of the preceding trail. But, in general the range can be any subset of the (potentially 256) entries in the preceding path. The purpose of the procedure is to determine this range, to shorten the older trail so as to have only the elements in this range, and keeping track of how to modify the newer trail so the information is preserved. Then the newer trail is modified appropriately. The purpose of the scoreboard interface is to determine the range of the newer trail. This scoreboard interface reuses the candidate word of the trail procedure interface and also uses the scoreboard register 185. This scoreboard register 185 is the interface to a 265 bit shift register that the HBTDP unit 180 needs for trail production. A write to the scoreboard register 185 of a value ≧256 will clear the shift register 185 and a write of a value <256 will set the bits in the offset register 182. Bits are set for each entry in the newer trail, using the write to the scoreboard register 185.

In general, a read from the prototype register 183 returns an address. That address is the base address that was previously written to the offset register 182 plus an index which indicates smallest 0 entry in the shift register 185 subject to the constraint that that index is greater than the index reflected by the previous read of the prototype register 183. For example, if only the bits 19, 7, and 10 of the shift register 185 have value 0, then successive reads of the prototype register 183 will return the values offset+7, offset+10 and offset+19. The processor unit 150 reads from the prototype register 183 a value corresponding to an index<256.

The path metric register 187 is a 16 bit read-only register. This register 187 stores an unsigned value that is meaningful only when the HBTDP unit 180 is in a trail__in__progress mode following a run__flush operation. This value provides a measure of the confidence in decoding of a frame.

Operation of the Preferred Embodiments

The decoding of convolutionally-encoded symbols is provided, according to the present invention, in three stages. In the first stage, the transition metrics are generated in response to the receipt of the transmitted symbols. The internal state of the block trellis decoder unit is maintained in several tables. The table entries include a history field, a field that is determined by the possible paths of the group of symbols, an index field, a field that identifies a history field in the preceding table, and a path metric field, a field that establishes the deviation of the path from the path most likely to have been followed by the encoded symbols. In the important IS-95 protocol, the table entries of the tables can be expressed in fields having 8 bits, a field length particularly convenient for manipulation by modem data processing systems. A single surviving path is identified by some criterion, e.g., only one path survives, the remaining possible paths having been discarded. By retracing the table entries of the surviving path, the transmitted symbols can be determined and, based on the determination of the transmitted symbols, the original signals can be determined. The procedure is summarized in FIGS. 11A–11C.

Referring once again to FIG. 13A–FIG. 13D, the operation of the block trellis decoder using the hardware block trellis decoder (HBTDP) unit can be understood as follows. The HBTDP unit can be used for continuous or framed decoding. Control unit receives a pair of signals for each transmitted symbol. From the pair of signals, the control unit computes the transition metrics and loads the transition metrics into the TR00 register, the TR01 register, the TR10 register, and the TR11 register. Then the control unit 150 writes a control word to the HBTDP_CTRL register to update the internal tables to reflect the new group of metrics. After the control unit has provided 8 groups of transition metrics, then the control unit must read the HLENGTH register and the HISTORY register before presenting the additional groups of transition metrics to the HBTDP unit. The exception to this procedure is that the output registers are not read after the first group of eight bits following HBTDP_RES=1. (As will be clear, the problem of synchronization between the control unit and the HBTDP unit can present a problem, i.e., the control unit can possibly be applying transition metrics (and control signals) faster than the HBTDP unit can process the incoming signals. One solution would be to provide each transition metric register with an eight-deep (in the case where B=8) first-in/first-out {FIFO} register. The control unit can apply signals to the FIFO registers without regard to the HBTDP unit activity. Another possible solution is to insure that the HBTDP unit completes its processing activity in a predetermined time and the control unit can provide a NOP (no operation) instruction to delay the application of the next group of transition metric signals. Another possibility would be the use of one of the reserved bits in the HBTDERR field of the HLENGTH registers to signal to the control unit that the next set of transition metrics can be written.) Generally, each time the control unit transfers transition metrics for eight consecutive encoded bits, the control unit reads from the output registers of the HBTDP unit an array of 16-bit data. (As indicated above, the exception to this procedure is the eight bits that start with HBTDP_RES=1.) The array has a variable specified by the low order eight bits of HLENGTH register. Each individual element of one of the arrays consists of the two eight bit fields of the HISTORY register. The high order eight bits enumerate the possible decoding of the last eight bits (actually the eight bits before the most recent eight bits) and the low order eight bits provide an index into the preceding array as described previously.

Figure 14:
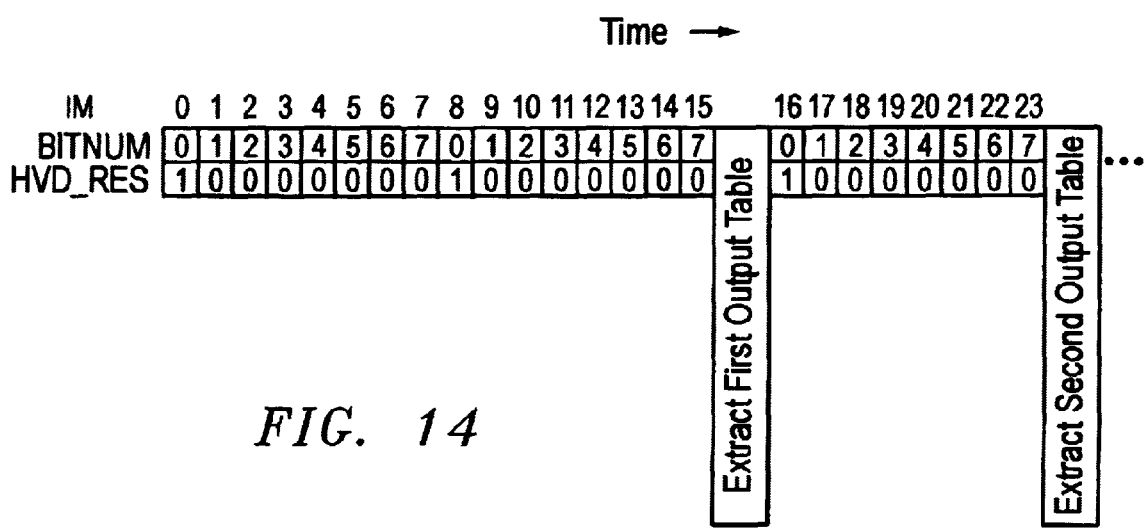
FIG. 14 illustrates the timeline for the transfer of tables from the hardware block trellis decoder unit to the control unit.

With respect to framed operation, the IS-95 specifies that the traffic channel data is prepared in distinct frames of a number of bits, the number of bits depending on the data rate being used. The data rate can change from frame to frame. The convolutional encoder is, at the start of each frame at a state 0 (of 256 possible states). Moreover, after the information bits are passed through the encoder, eight tail bits (all zero) are fed into the encoder to return the encoder to state 0. For the first bit of a frame, the control unit sets the HBTDP_RES bit to start from state). Subsequent bits of the frame HBTDP_RES cleared (i.e., set=0). For each of the last eight bits of the frame (i.e., the tail bits), the control unit sets the FLUSH bit. The FLUSH bit is of course clear for all of the other bits of the frame. As noted above, the control unit receives a sequence of output tables. The control unit receives an output table from the HBTDP unit after all but the first eight sets of transition tables. This operation of this transfer is illustrated in the time line illustrated in FIG. 14. In the framed mode of operation, the FLUSH bit is set for each of the last eight bits of the frame and, as a consequence, the very last output table has but a single entry. The high order eight bits of the last entry are the last eight bits of the decoded frame and the low eight bits of that entry serves as an index into the second-from-last array. The selected entry (at that index) is likewise used to produce the preceding eight bits of the decoded frame and an index into the third-from-last table, etc. The process of stepping backwards through the through the tables in this manner is referred to as back-tracking. Recall that the CLIP_METRIC register is provided in the HBTDP unit to promote decoding efficiency. The intended use of for this register stems from the fact that, for the IS-95, the coding rate for the traffic channel is not known, a priori, and it is often necessary to decode the same frame at different rates. After a frame has been decoded at one or more rates, the control unit may determine that the paths with metrics greater than some particular value are of no interest. If the CLIP_METRIC register is set to this value, those paths will not be reported by the HBTDP unit. In this case, output arrays may sometimes become empty, as indicated by a value of the LENGTH field of zero. Decoding of a frame at a particular rate can be abandoned early when this happens. Even when this does not happen, the arrays can be shortened through the use of the CLIP_METRIC register.

With respect to the continuous mode of operation, in the IS-95, the paging and sync channels must also be decoded. The start of decoding on one of these channels corresponds in some sense the start of a frame, and so the HBTDP_RES field is set on this occasion. However, continuous mode operation is complicated by the fact that there is no end of frame and no output table that is guaranteed to have only a single entry. In fact, a table with a signal entry may not to occur often. Nonetheless, every eight bits, the control unit receives and must store a new array of tables from the HBTDP unit. The decoded data must eventually be extracted from these tables, both because the encoded data is needed and because the memory has a finite storage capacity. Any time after several table arrays have been transferred from the HBTDP unit, the control unit can attempt to extract the decoded bit-stream. Because no single starting point can be determined, the control unit must back-track from each entry of some chosen array. In general, not all entries in the preceding array correspond to some index from the chosen array. Therefore, it is possible (conceptually if not actually) to simplify preceding array by removing the non-referenced members. Repeating this back toward the first table array, the memory needed to store all of the arrays is at least reduced. In practice, after a few iterations, only one member will remain in an array. Once this condition occurs, the processor can proceed as in the framed case. The algorithm for back-tracking provides for flexibility. Simplification of the arrays can be used to reduce the memory requirements. Or the simplification of the arrays can be delayed in order to avoid excessive back-tracking. Whatever approach is taken, the processing requirements should be much less than the bit-at-a time techniques of the prior art.

Because the n binary digits associated with and identifying each state also identifies the last n transitions, the state is a natural storage unit for identifying the previous n transitions. Thus, a series of files that includes all the surviving states identifies the last n transitions for all of the surviving paths and are thus referred to as a history file. Associated with each surviving state is an index file that "points" to the appropriate history subfile in the next previous file. Using the index file, the path can be traced back to the initial state. As a result of this tracing back, the surviving path can be determined.

As indicated above, when a single final surviving state is reached, then the "most likely" path can be identified through the tracing back procedure. Even in a continuous decoding, when there is no final state, the method of issuing tables at the end of each block of 8 bits provides and easy way to find a good position from which to start backtracking (viz. when a table is short).

The present invention is particularly well suited to the IS-95 conventions. In this convention, the states are determined by an eight-bit binary number. Because the processing device is typically implemented in a byte, or multiple byte format, the use of eight-bit quantities is particularly advantageous.

It will be further clear that the processing of transition metrics in blocks of symbols having B (=constraint length−1) members to provide tables having partial path information is particularly convenient, however, the division of the symbols in groups of B symbols is not essential. Blocks of symbols having a different number of members can be similarly processed. For instance, the number of members can be an integer times B. Such a division on symbols can be useful when B is small, wherein tables can be generated that more fully populate word-length data fields.

In the modified decoder, the variable length tables are transferred every n*B symbols, where B is (constraint length−1). The first table is transferred after (n+1)*B symbols rather than after 2B symbols. Internal to the block decoder unit, the butterfly operations operate as before, but at the end of each block of B symbols the history entries are left-shifted by B bits and the low order B bits of the k-th history entry are set to k. In this way, at the end of n*B symbols the history entries have n*B significant bits. This embodiment is useful is for small constraint lengths, e.g., 5. In this case using the multiple of 3 would result in B=12 so that the variable length tables would again be 16-bits wide (12 bits of the history field+4 bits of index field. For constraint length 3, a multiple of 7 would similarly result in B=14, and with index entries of two bits, would result in 16 bit fields.

The second embodiment, the operation of which was described with respect to FIGS. 15, 16, 17A, 17B and 17C, provides an improved interface between the processor unit and the peripheral unit. In particular, this embodiment provides a trail compression that results in a simplified decoding procedure.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A block trellis decoder for decoding a sequence of convolutionally-encoded symbols, the block trellis decoder comprising:
   a processing unit, the processing unit receiving the sequence of convolutionally-encoded symbols, the processing unit generating transition metrics for each state of a symbol; and
   a hardware decoder unit responsive to transition metrics for each block including at least B symbols, the hardware decoder unit generating a fixed length table for each block of transition metrics, the fixed length table including a history entry, an index entry, and a path metric entry, the fixed length tables identifying surviving partial paths for the blocks of symbols, the hardware decoder unit transferring the fixed length tables to the processing unit, the processing unit determining surviving paths from the fixed length tables, the hardware decoder unit including an interface apparatus having:
      a plurality of transition metric registers for receiving from the data processing unit the transition metrics generated as a result of each symbol;
      a maximum path metric register responsive to signals from the data processing unit for storing a predetermined maximum allowed path metric;
      a control register responsive to the data processing unit for storing a field resulting in an initialization of the hardware decoder and a number field determining when updating will take place; and
      a history register for storing a history field and an index field of the fixed length table for retrieval by the data processing unit.

2. The method as recited in claim 1 wherein each block including at least B symbols comprises a block including at least n·B symbols.

3. The decoder as recited in claim 1 wherein the transition metric registers include synchronization apparatus, the synchronization apparatus preventing transition metric data from being lost when the hardware decoder unit is not ready to process the transition metrics retrieved from a next block including at least B symbols.

4. The decoder as recited in claim 1 further including a length register, wherein the length register indicates to the processing unit when the hardware decoder unit is not ready to transfer data.

5. The decoder as recited in claim 1 wherein the hardware decoder unit includes butterfly apparatus, the butterfly apparatus generating and updating the fixed length table.

6. A method for block-decoding a sequence of convolutionally-encoded symbols compromised by noise in transmission and reception comprising:
   dividing the sequence of symbols into groups of symbols having a preselected number of symbols;
   for each group of symbols, generating a table, the table having table entries including a history field, an index field, and a path metric field, the table identifying surviving partial paths for said each group of symbols, each of said table entries identifying a surviving partial path in a next previous table, the surviving partial path identified in the next previous table being a part of the surviving partial path identified by the table; and
   based on a predetermined criterion, assembling at least one surviving path from the tables.

7. The method as recited in claim 6 wherein the preselected number of symbols is B, B being equal to the constraint length of the encoder encoding the symbols minus 1.

8. The method as recited in claim 6, wherein the preselected number of symbols is n·B, n being an integer and B being equal to the constraint length of the encoder encoding the symbols minus 1.

9. The method as recited in claim 6 wherein the surviving partial paths are utilized to decode the sequence of symbols.

10. The method as recited in claim 6, wherein the history field includes a record of transitions for a surviving partial path determined by a next previous group of symbols.

11. The method as recited in claim 6 wherein the index field identifies a history field in a table generated by a next previous group of symbols.

12. The method as recited in claim 6 wherein the path metric field identifies a deviation from an ideal surviving path.

13. For use with a processor unit, a peripheral unit for accelerating the block-decoding of a sequence of convolutionally-encoded symbols, the peripheral unit comprising:
   an internal memory of N bits;
   transition metrics registers to store transition metrics for each state of a symbol;
   a trellis decoding apparatus responsive to transition metrics, the trellis decoding apparatus including
      a fixed length table having an entry for each state, and
      a butterfly apparatus performing butterfly operations on a predetermined number of symbols to update a fixed length table, wherein the updated fixed length table identifies surviving partial paths for states of the predetermined number of symbols; and
   history registers to store entries of the fixed length table when the fixed length table has been updated for a final symbol, and to transfer the fixed length table to the processor unit, wherein the processor unit decodes the sequence of convolutionally-encoded symbols from the transferred fixed length table;
   a scorecard register, wherein the processor unit can write signal groups to the scorecard register;
   a prototype register, wherein the processor unit can write signal groups to and read signal groups from the prototype register, all of the N bits of internal memory being set to zero when the processor unit writes a signal group with a value of N or greater to the scoreboard register, a corresponding bit in the internal memory is set equal to one when the processor unit writes a signal group having a value between zero and N−1 to the scoreboard register, and successive reads of the prototype register return numbers n< or =N−1 for which corresponding bits are zero;

an offset register, wherein when the processor unit writes a non-zero value to the offset register, subsequent successive reads of the prototype register will return a sum of the non-zero value and a number n; and a candidate register, wherein the candidate register is a second prototype register that returns signal group values greater than a most recently read value from the prototype register, wherein the processor unit includes a memory unit to store the transferred fixed length table, and prior to decoding the sequence of convolutionally-encoded symbols from the transferred fixed length table, the processor unit forms a variable length table from the transferred fixed length table.

14. For use with a processor unit, a peripheral unit for accelerating the block-decoding of a sequence of convolutionally-encoded symbols, the peripheral unit comprising:

transition metrics registers to store transition metrics for each state of a symbol;

a trellis decoding apparatus responsive to transition metrics, the trellis decoding apparatus including a fixed length table having an entry for each state, wherein the fixed length table includes a history entry, an index entry, and a path metric entry, and a butterfly apparatus performing butterfly operations on a predetermined number of symbols to update a fixed length table, wherein the updated fixed length table identifies surviving partial paths for states of the predetermined number of symbols; and history registers to store entries of the fixed length table when the fixed length table has been updated for a final symbol, and to transfer the fixed length table to the processor unit, wherein the processor unit decodes the sequence of convolutionally-encoded symbols from the transferred fixed length table.

15. The peripheral unit as recited in claim 14, wherein the processor unit includes a memory unit to store the transferred fixed length table, wherein prior to decoding the sequence of convolutionally-encoded symbols from the transferred fixed length table, the processor unit forms a variable length table from the transferred fixed length table.

16. The peripheral unit as recited in claim 15 wherein the peripheral unit further comprises a prototype register to provide data to the processor unit, and the data provided to the processor unit identifies entries to appear in the variable length table.

17. The peripheral unit as recited in claim 16 wherein addresses in the variable length table that are stored in the processor unit are transferred to the peripheral unit utilizing the prototype register.

18. The peripheral unit as recited in claim 16 wherein the processor unit transfers data to the peripheral unit through the prototype register and the data transferred to the peripheral unit identifies offsets in the variable length table.

19. The peripheral unit as recited in claim 15, wherein the peripheral unit further comprises a memory location to identify an address of the fixed length table.

20. The peripheral unit as recited in claim 19, wherein the peripheral unit includes an offset register to transfer the address of the fixed length table from the processor unit to the peripheral unit.

21. The peripheral unit as recited in claim 15 further comprising:

a candidate register, wherein the processor unit receives data from the peripheral unit through the candidate register indicating potential duplicate table entries; and a prototype register, wherein the peripheral unit receives data from the processor unit through the prototype register identifying duplicate table entries.

22. The peripheral unit as recited in claim 15, further comprising a score-board register having locations to identify whether an entry in a fixed length table has been entered in a variable length table.

23. The peripheral unit as recited in claim 15, further comprising a score-board register, the score-board register having locations identifying whether an entry in a fixed length table has been entered in a variable length table.

24. The peripheral unit as recited in claim 14 wherein the predetermined number of symbols is B, B being equal to the constraint length of the encoder encoding the symbols minus 1.

25. The peripheral unit as recited in claim 14, wherein the predetermined number of symbols is n·B, n being an integer and B being equal to the constraint length of the encoder encoding the symbols minus 1.

26. The peripheral unit as recited in claim 14, wherein the processor unit generates a variable length table from the transferred fixed length table.

27. The peripheral unit as recited in claim 26 further comprising a plurality of auxiliary registers to provide data fields to assist the processor unit in generating the variable length table from the fixed length table.

28. The peripheral unit as recited in claim 27, wherein the fixed length table is shortened by removing duplicate history entries.

29. The peripheral unit as recited in claim 27, wherein the fixed length table is shortened by removing history entries associated with a path metric that exceeds a preselected value.

30. The peripheral unit as recited in claim 27, wherein partially decoded paths are stored as sequential trail member table entries in the processor unit.

31. The peripheral unit as recited in claim 14 further comprising a control register to store control data groups from the processor unit, wherein the control data groups are utilized to control the peripheral unit.

32. The peripheral unit as recited in claim 14, wherein the control register stores state data groups from the peripheral unit, and the state data groups identify a current state of the peripheral unit for the processor unit.

33. The peripheral unit as recited in claim 32, wherein the processor unit is a digital signal processing unit.

34. A method of accelerating the block-decoding of a sequence of convolutionally-encoded symbols comprising:

calculating transition metrics for each state of a symbol;

performing a plurality of butterfly operations on the transition metrics for a predetermined number of consecutive symbols to update entries for a fixed length table, wherein the fixed length table includes a history entry, an index entry, and a path metric entry and entries in the fixed length table identify surviving partial paths; and when the transition metrics associated with a final symbol of the predetermined number of consecutive symbols is processed and the fixed length table has been updated, generating a variable length table.

35. The method of claim 34 further comprising assembling surviving partial path data for each surviving path in sequential memory locations.

36. The method as recited in claim 35, wherein the generating is implemented in a processor unit, the performing is implemented in a peripheral unit, and the sequential memory locations are in a processor unit memory.

37. The method as recited in claim 36 further comprising:
transferring the transition metrics from the processor unit to the peripheral unit utilizing transition metric registers in the peripheral unit; and
transferring the surviving partial path data from the peripheral unit to the processor unit utilizing history registers.

38. The method as recited in claim 37, wherein generating a variable length table in the processor unit comprises:
transferring the surviving partial path data by exchanging prototype codes, candidate codes, and offset codes.

39. The method as recited in claim 35, wherein the assembling is implemented in a processor unit and in a peripheral unit.

40. The method as recited in 34, wherein the convolutionally-encoded symbols are encoded with a constraint length of N, the predetermined number is N−1 and a number of states associated with each symbol is $2^{(N-1)}$.

41. The method as recited in 34, wherein the convolutionally-encoded symbols are encoded with a constraint length of N, the predetermined number is n·(N−1) where n is an integer, and a number of states associated with each symbol is $2^{(N-1)}$.

42. The method as recited in claim 34, wherein the convolutionally-encoded symbols are encoded in a IS-95 format, the predetermined number is 8, and a number of states associated with each symbol is 256.

43. A block trellis decoder for decoding a sequence of convolutionally-encoded symbols, the block trellis decoder comprising:
a processing unit to generate a plurality of transition metrics corresponding to a block of said convolutionally-encoded symbols and to determine a surviving path utilizing a fixed length table identifying surviving partial paths corresponding to said block of said convolutionally-encoded symbols, wherein said fixed length table comprises a history entry, an index entry, and a path metric entry; and
a hardware decoder unit, said hardware decoder unit comprising a plurality of transition metric registers to store said transition metrics, a maximum path metric register to store a maximum allowed path metric, a control register, and a history register, to generate a path metric utilizing said transition metrics, to compare said path metric with said maximum allowed path metric and, to generate said fixed length table in response to a comparison of said path metric and said maximum allowed path metric.

* * * * *